(12) United States Patent
Chiu

(10) Patent No.: US 12,482,768 B2
(45) Date of Patent: Nov. 25, 2025

(54) SEMICONDUCTOR STRUCTURE HAVING PROTECTIVE LAYER ON SIDEWALL OF CONDUCTIVE MEMBER AND MANUFACTURING METHOD THEREOF

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 449 days.

(21) Appl. No.: 18/077,375

(22) Filed: Dec. 8, 2022

(65) Prior Publication Data

US 2024/0194621 A1 Jun. 13, 2024

(51) Int. Cl.
*H01L 23/00* (2006.01)

(52) U.S. Cl.
CPC .............. *H01L 24/02* (2013.01); *H01L 24/05* (2013.01); *H01L 2224/02311* (2013.01); *H01L 2224/02331* (2013.01); *H01L 2224/02375* (2013.01); *H01L 2224/02381* (2013.01); *H01L 2224/0239* (2013.01); *H01L 2224/0401* (2013.01); *H01L 2224/05008* (2013.01); *H01L 2924/01022* (2013.01); *H01L 2924/01028* (2013.01); *H01L 2924/01029* (2013.01); *H01L 2924/01079* (2013.01)

(58) Field of Classification Search
CPC ............. H01L 24/05; H01L 2224/0239; H01L 2224/0401; H01L 2924/01022; H01L 2924/01028; H01L 2924/01029; H01L 2924/01079; H01L 23/5386; H01L 21/76829; H01L 23/5383; H01L 2224/023; H01L 23/5226; H01L 24/17; H01L 24/08
See application file for complete search history.

(56) References Cited

U.S. PATENT DOCUMENTS

| | | | |
|---|---|---|---|
| 2009/0102032 A1* | 4/2009 | Schneegans | ...... H01L 23/53238 257/676 |
| 2014/0061920 A1* | 3/2014 | Hirano | ..................... H01L 24/05 257/751 |
| 2019/0035727 A1* | 1/2019 | Pipia | ....................... H01L 24/03 |

(Continued)

FOREIGN PATENT DOCUMENTS

| | | |
|---|---|---|
| CN | 102270610 A | 12/2011 |
| TW | 201916276 A | 4/2019 |

(Continued)

OTHER PUBLICATIONS

Office Action and and the search report mailed on Jan. 7, 2025 related to Taiwanese Application No. 113100927.

(Continued)

*Primary Examiner* — Ajay Ojha
*Assistant Examiner* — Sandra Milena Rodriguez Villanu
(74) *Attorney, Agent, or Firm* — Xuan Zhang

(57) ABSTRACT

The present application provides a semiconductor structure including a substrate and a conductive member over the substrate. The conductive member includes a seed layer over the substrate, a core disposed over the seed layer, and a protective layer disposed on a top surface of the core and surrounding a sidewall of the core. A method of manufacturing a semiconductor structure is also disclosed.

14 Claims, 21 Drawing Sheets

(56) References Cited

U.S. PATENT DOCUMENTS

2019/0189507 A1* 6/2019 Gambee ............ H01L 21/76873
2022/0223536 A1* 7/2022 Wang ................ H01L 21/76831

FOREIGN PATENT DOCUMENTS

TW            202121597 A     6/2021
TW            202230684 A     8/2022

OTHER PUBLICATIONS

Abstract of Office Action and and the search report mailed on Jan. 7, 2025 related to Taiwanese Application No. 113100927.
Office Action and Search Report mailed on Feb. 7, 2024 related to Taiwanese Application No. 112116121.
Office Action and Search Report mailed on Jul. 16, 2024 related to Taiwanese Application No. 113100927.

* cited by examiner

SEMICONDUCTOR STRUCTURE HAVING PROTECTIVE LAYER ON SIDEWALL OF CONDUCTIVE MEMBER AND MANUFACTURING METHOD THEREOF

TECHNICAL FIELD

The present disclosure relates to a semiconductor structure, and a method of manufacturing the semiconductor structure. Particularly, the present disclosure relates to a semiconductor structure having a protective layer on a sidewall of a conductive member, and a method of manufacturing the semiconductor structure including forming the conductive member having the protective layer on the sidewall.

DISCUSSION OF THE BACKGROUND

Semiconductor devices are used in a variety of electronic applications, such as personal computers, cellular telephones, digital cameras, and other electronic equipment. Fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve integration density of the microelectronic components by continual reduction of minimum feature size, which allows more components to be integrated into a given area. Smaller package structures with smaller footprints are developed to package the semiconductor devices, in order to facilitate formation and integration of components of different sizes. However, such formation and integration may increase complexity of manufacturing the semiconductor devices. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate and a conductive member disposed over the substrate. The conductive member includes a seed layer disposed over the substrate, a core disposed over the seed layer, and a protective layer disposed on a top surface of the core and surrounding a sidewall of the core.

Another aspect of the present disclosure provides a semiconductor structure. The semiconductor structure includes a substrate, and a first conductive member disposed over the substrate. The first conductive member includes a first seed layer disposed over the substrate, a first core disposed over the first seed layer, a first protective layer disposed on a top surface of the first core and on a sidewall of the first core, and a first capping layer disposed over the first protective layer.

Another aspect of the present disclosure provides a method of manufacturing a semiconductor structure. The method includes steps of providing a substrate having a first layer; forming a photoresist over the first layer; removing a first portion of the photoresist to form a first opening exposing a first portion of the first layer; disposing a first material within the first opening to form a first core; and removing a second portion of the photoresist to form a first gap surrounding the first core. The method further includes steps of disposing a second material within the first gap and over the first core to form a first protective layer; disposing a third material over the first protective layer to form a first capping layer; removing the photoresist after the formation of the first capping layer; and removing a portion of the first layer to form a first undercut between the first protective layer and the substrate and to form a first seed layer between the first core and the substrate.

Because a conductive member includes a protective layer that is disposed on a top surface of a core and that surrounds a sidewall of the core, the protective layer mitigates galvanic corrosion during an etching process, thereby reducing or eliminating loss of the core due to the galvanic corrosion. As such, the conductive member having the protective layer may maintain strength and reliability while having a relativity narrow width. Further, an undercut formed on a seed layer under the core may be reduced, and therefore collapse or fracture of the conductive member can be prevented. A reliability of a semiconductor structure having such conductive member is increased or improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
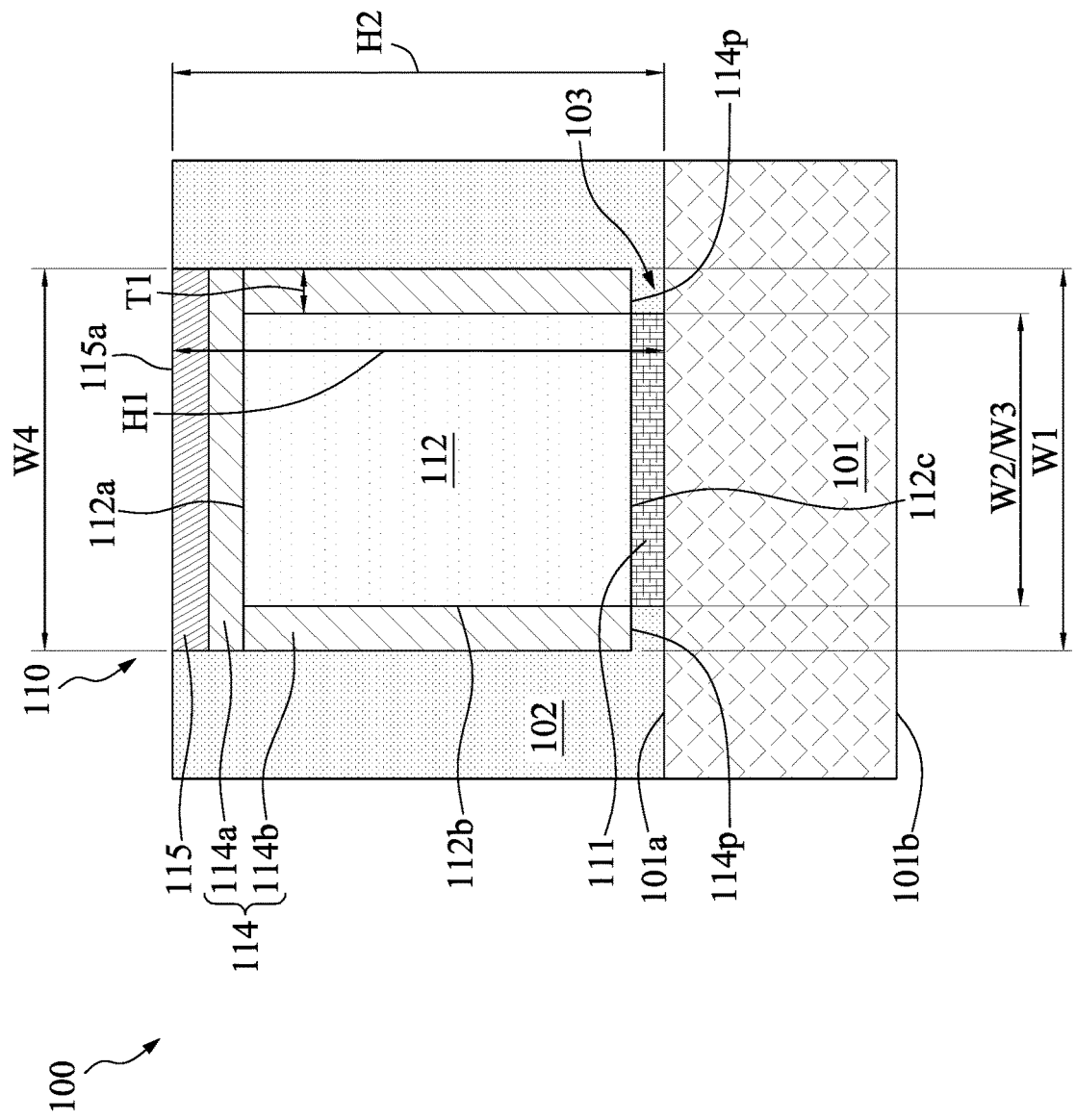
FIG. 1 is a cross-sectional view of a first semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

In the present application, a semiconductor structure having a protective layer on a sidewall of a conductive member, and a manufacturing method of the semiconductor structure, are provided. The semiconductor structure includes a conductive member disposed over a substrate, wherein the conductive member includes a seed layer disposed over the substrate, a core disposed over the seed layer, and a protective layer disposed on a top surface of the core and surrounding a sidewall of the core.

Figure 2:
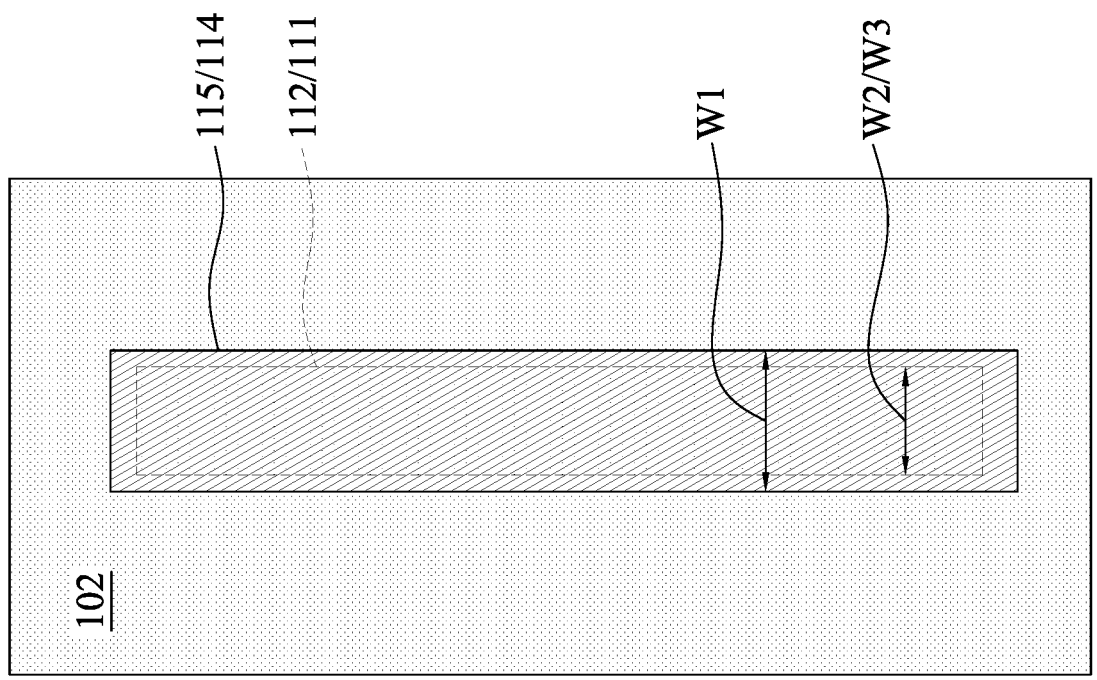
FIG. 2 is a top view of the first semiconductor structure in accordance with some embodiments of the present disclosure.

FIG. 1 is a schematic cross-sectional view of a first semiconductor structure 100 in accordance with some embodiments of the present disclosure. FIG. 2 is a top view of the first semiconductor structure 100 in accordance with some embodiments of the present disclosure. In some embodiments, referring to FIGS. 1 and 2, the first semiconductor structure 100 is a part of a package or a device. In some embodiments, the first semiconductor structure 100 includes a die. In some embodiments, the first semiconductor structure 100 includes a substrate 101, a first conductive member 110 disposed over the substrate 101, and a dielectric layer 102 over the substrate 101 and surrounding the first conductive member 110.

In some embodiments, the substrate 101 is a semiconductive layer. In some embodiments, the substrate 101 includes semiconductive material such as silicon, germanium, gallium, arsenic, or a combination thereof. In some embodiments, the substrate 101 is a silicon substrate. In some embodiments, the substrate 101 includes a dielectric layer thereon. In some embodiments, the substrate 101 includes silicon dioxide or the like. In some embodiments, a top surface of the substrate 101 has a rectangular or circular shape or any other suitable shape.

In some embodiments, the substrate 101 includes various features formed therein or thereover. In some embodiments, the substrate 101 includes a variety of electrical circuits suitable for a particular application. In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are subsequently formed in or over the substrate 101 and configured to electrically connect to an external circuitry.

In some embodiments, the substrate 101 is defined with a first surface 101*a* and a second surface 101*b* opposite to the first surface 101*a*. In some embodiments, the first surface 101*a* is a front side of the substrate 101, and the second surface 101*b* is a back side of the substrate 101. In some embodiments, various features are formed in or over the first surface 101*a* of the substrate 101.

In some embodiments, the first conductive member 110 is disposed on the substrate 101. In some embodiments, the first conductive member 110 is disposed on the first surface 101*a* of the substrate 101. In some embodiments, the first conductive member 110 is configured to connect the component or circuitry of the substrate 101 to an external interconnection. In some embodiments, the first conductive member 110 is a redistribution layer (RDL) line. In some embodiments, the first conductive member 110 appears as a strip from a top view perspective. In some embodiments, a width W1 of the first conductive member 110 is less than 5 μm.

In some embodiments, the first conductive member 110 includes a first seed layer 111 disposed over the substrate 101, a first core 112 disposed over the first seed layer 111, and a first protective layer 114 disposed on a top surface 112*a* of the first core 112 and surrounding a sidewall 112*b* of the first core 112. In some embodiments, a dielectric layer 102 is disposed over the substrate 101 and surrounds the first conductive member 110.

In some embodiments, the first seed layer 111 is disposed between the first core 112 and the substrate 101. In some embodiments, the first seed layer 111 is in contact with a bottom wall 112*c* of the first core 112. In some embodiments, the first seed layer 111 is a single layer or a composite stack and is formed with material such as copper, titanium, tungsten, tantalum, titanium/copper alloy, or a combination thereof. In some embodiments, the first seed layer 111 includes a titanium layer and a copper layer.

In some embodiments, the width W1 of the first conductive member 110 is greater than a width W2 of the first seed layer 111. In some embodiments, a width W3 of the first core 112 is equal to the width W2 of the first seed layer 111. In some embodiments, a first undercut 103 surrounds the first seed layer 111. In some embodiments, the first undercut 103 is formed between the first protective layer 114 and the substrate 101.

In some embodiments, the first core 112 covers the first seed layer 111. In some embodiments, the first core 112 includes conductive material such as copper. In some embodiments, the bottom wall 112*c* of the first core 112 is in contact with the first seed layer 111.

In some embodiments, the first protective layer 114 covers and surrounds the first core 112 from a top view perspective. In some embodiments, the first protective layer 114 is in contact with the top surface 112a of the first core 112 and the sidewall 112b of the first core 112. In some embodiments, the first protective layer 114 is conformal to the top surface 112a of the first core 112 and the sidewall 112b of the first core 112. In some embodiments, the first protective layer 114 includes a first portion 114a disposed over the first core 112 and a second portion 114b surrounding the first core 112.

In some embodiments, a thickness T1 of the first protective layer 114 is between 0.2 μm and 1 μm. In some embodiments, the thickness T1 of the first protective layer 114 is 4% to 10% of the width W1 of the first conductive member 110.

In some embodiments, compared to a first material included in the first core 112, a second material included in the first protective layer 114 is less susceptible to corrosion by acid, so the second material can protect the first material from being corroded by acid, and the first conductive member 110 having the first protective layer 114 can thereby have greater reliability than conventional conductive members. In some embodiments, the second material is more cathodic than the first material. In some embodiments, an anodic index of the second material is greater than an anodic index of the first material. In some embodiments, the first protective layer 114 includes nickel. Nickel has an anodic index of −0.30, while copper has an anodic index of −0.35.

In some embodiments, the first conductive member 110 further includes a first capping layer 115 disposed over the first protective layer 114 and the first core 112. In some embodiments, the first portion 114a of the first protective layer 114 is disposed between the first capping layer 115 and the first core 112, and the second portion 114b of the first protective layer 114 is disposed under the first capping layer 115. In some embodiments, first capping layer 115 is in contact with the first portion 114a of the first protective layer 114.

In some embodiments, a width W4 of the first capping layer 115 equals the width W1 of the first conductive member 110. In some embodiments, the width W4 of the first capping layer 115 is substantially greater than the width W3 of the first core 112. In some embodiments, the width W4 of the first capping layer 115 is substantially greater than the width W2 of the first seed layer 111.

In some embodiments, the first capping layer 115 includes a third material, and the third material included in the first capping layer 115 is less susceptible to corrosion by acid to corrosion by acid than the first material, so the third material can protect the first material from being corroded by acid, and the first conductive member 110 having the first capping layer 115 can thereby have greater reliability than conductive members of the prior art. In some embodiments, the third material included in the first capping layer 115 is less susceptible to corrosion by acid than the second material. In some embodiments, the third material is more cathodic than the first material. In some embodiments, the third material is more cathodic than the second material. In some embodiments, an anodic index of the third material is greater than the anodic index of the first material. In some embodiments, the anodic index of the third material is greater than the anodic index of the second material. In some embodiments, the first capping layer 115 includes gold, which has an anodic index of −0.00.

In some embodiments, the dielectric layer 102 is disposed over the substrate 101 and surrounds the first conductive member 110. In some embodiments, the dielectric layer 102 surrounds the first capping layer 115, the first protective layer 114, the first core 112 and the first seed layer 111. In some embodiments, the dielectric layer 102 is in contact with the first capping layer 115, the first protective layer 114, the first core 112 and the first seed layer 111. In some embodiments, a periphery 114p of the first protective layer 114 is in contact with the dielectric layer 102. In some embodiments, a top surface 115a of the first capping layer 115 is exposed through the dielectric layer 102. In some embodiments, the dielectric layer 102 includes dielectric materials, such as spin-on glass (SOG), silicon oxide, silicon oxynitride, silicon nitride or the like.

Figure 3:
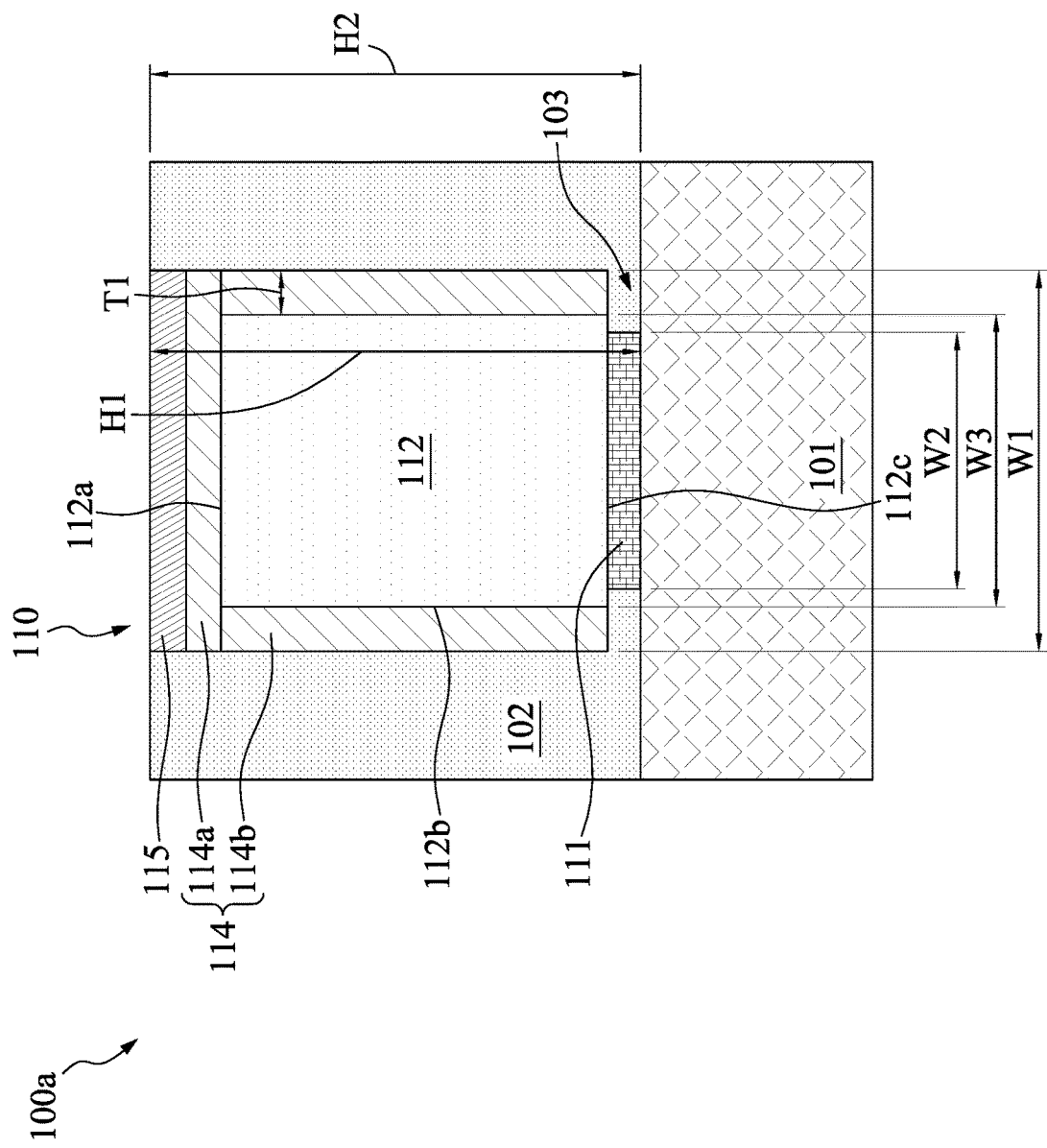
FIG. 3 is a cross-sectional view of a second semiconductor structure in accordance with some embodiments of the present disclosure.

FIG. 3 is a schematic cross-sectional view of a second semiconductor structure 100a in accordance with some embodiments of the present disclosure. In some embodiments, the second semiconductor structure 100a illustrated in FIG. 3 is similar to the first semiconductor structure 100 illustrated in FIGS. 1 and 2, except that, in the second semiconductor structure 100a, the width W3 of the first core 112 is greater than the width W2 of the first seed layer 111. In some embodiments, the dielectric layer 102 is in contact with a portion of the bottom wall 112c of the first core 112. In some embodiments, the undercut 103 of the second semiconductor structure 100a is deeper than the undercut 103 of the first semiconductor structure 100.

Figure 4:
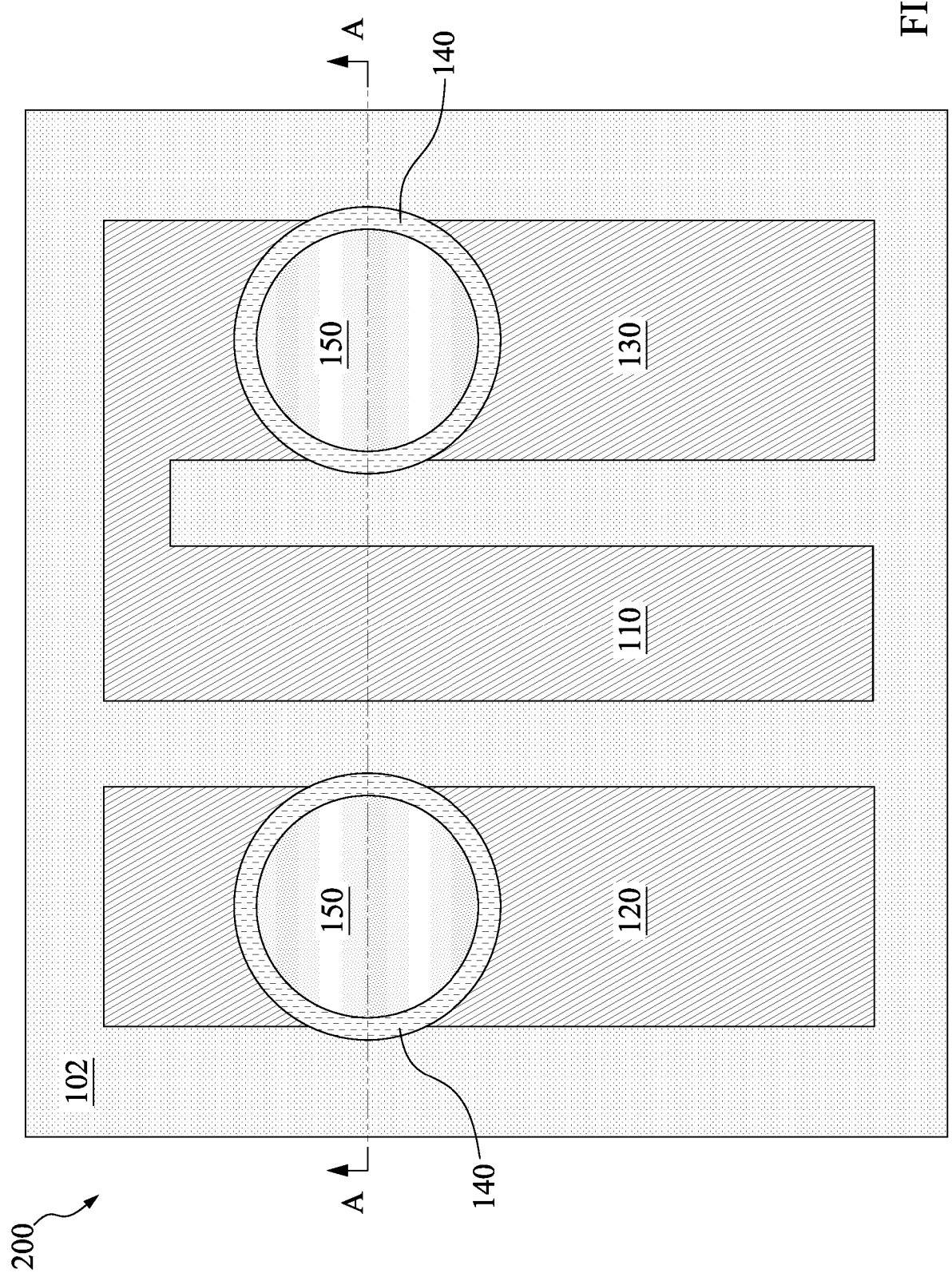
FIG. 4 is a top view of a third semiconductor structure in accordance with some embodiments of the present disclosure.
Figure 5:
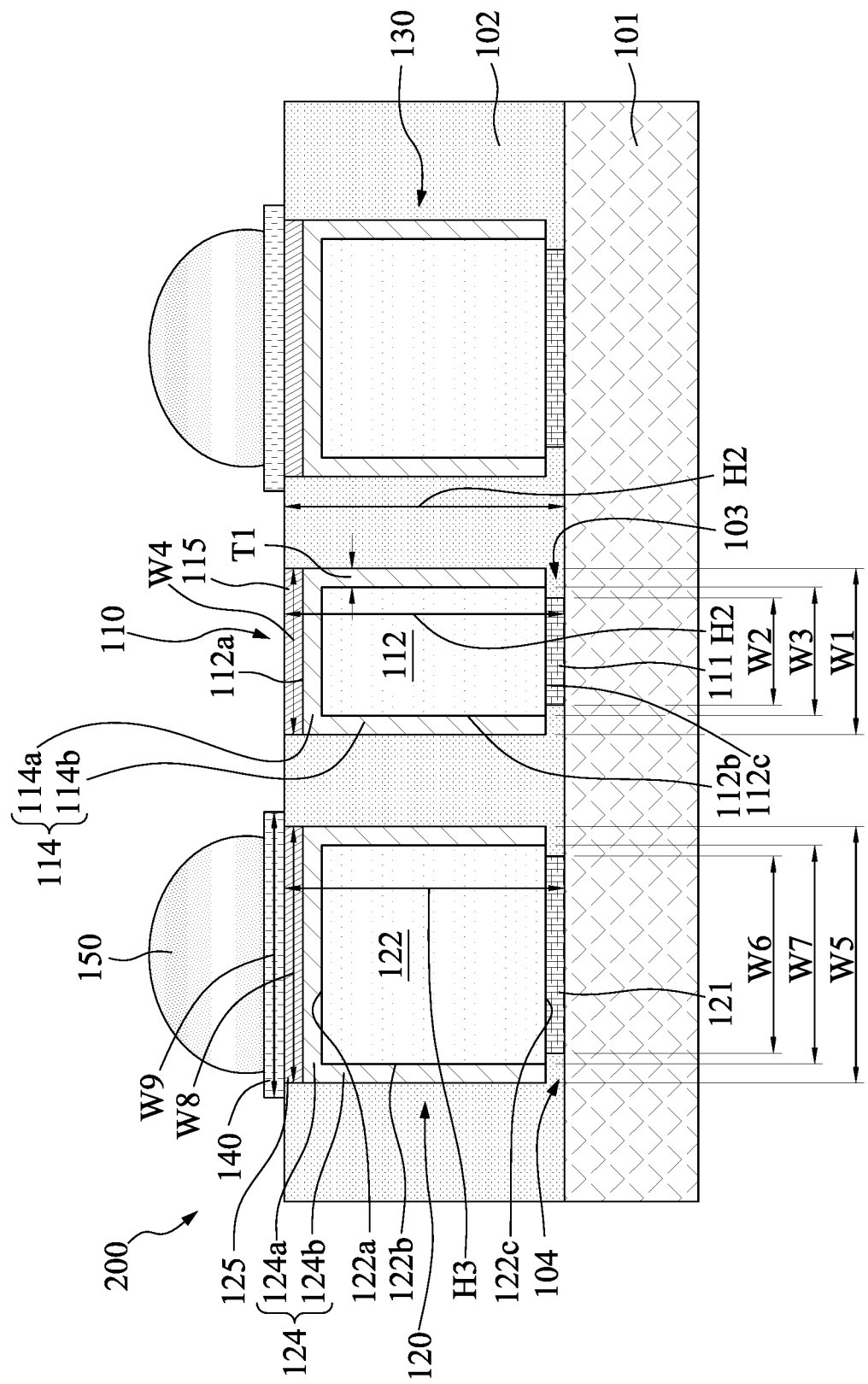
FIG. 5 is a cross-sectional view of the third semiconductor structure along a line A-A' in FIG. 4.

FIG. 4 is a top view of a third semiconductor structure 200 in accordance with some embodiments of the present disclosure. FIG. 5 is a cross-sectional view of the third semiconductor structure 200 along a line A-A' in FIG. 4. In some embodiments, the third semiconductor structure 200 illustrated in FIGS. 4 and 5 is similar to the second semiconductor structure 100a illustrated in FIG. 3, except the third semiconductor structure 200 further includes a second conductive member 120 disposed over the substrate 101 and adjacent to the first conductive member 110. In some embodiments, the third semiconductor structure 200 further includes a third conductive member 130 disposed over the substrate 101, and the first conductive member 110 is disposed between the second conductive member 120 and the third conductive member 130.

In some embodiments, the second conductive member 120 includes a second seed layer 121 disposed over the substrate 101, a second core 122 disposed over the second seed layer 121, and a second protective layer 124 disposed on a top surface 122a of the second core 122 and on a sidewall 122b of the second core 122. In some embodiments, the second protective layer 124 is conformal to the top surface 122a of the second core 122 and to the sidewall 122b of the second core 122. In some embodiments, the second conductive member 120 further includes a second capping layer 125 disposed over the second protective layer 124. In some embodiments, an undercut 104 surrounds the second seed layer 121.

In some embodiments, a width W6 of the second seed layer 121 is equal to a width W7 of the second core 122. In some embodiments, the width W6 of the second seed layer 121 is less than the width W7 of the second core 122.

In some embodiments, a configuration of the second conductive member 120 is similar to the configuration of the first conductive member 110, except that a width W5 of the second conductive member 120 is different from the width W1 of the first conductive member 110. In some embodiments, the width W5 of the second conductive member 120 is substantially greater than the width W1 of the first conductive member 110. In some embodiments, a width W8 of the second capping layer 125 is substantially greater than the width W6 of the second seed layer 121. In some embodiments, the width W8 of the second capping layer 125 is substantially greater than the width W7 of the second core 122. In some embodiments, a height H1 of the first conductive member 110 is equal to a height H3 of the second conductive member 120.

In some embodiments, the first seed layer 111 and the second seed layer 121 include a same material. In some embodiments, the first core 112 and the second core 122 include a same material. In some embodiments, the first protective layer 114 and the second protective layer 124 include a same material. In some embodiments, the first capping layer 115 and the second capping layer 125 include a same material.

In some embodiments, the dielectric layer 102 surrounds the first conductive member 110 and the second conductive member 120. In some embodiments, the dielectric layer 102 surrounds the first conductive member 110, the second conductive member 120 and the third conductive member 130. In some embodiments, the dielectric layer 102 is in contact with a portion of the second core 122.

In some embodiments, a bump pad 140 is disposed over the second conductive member 120. In some embodiments, the bump pad 140 is disposed over the dielectric layer 102 and electrically connected to the second conductive member 120. In some embodiments, the bump pad 140 is electrically coupled with the second capping layer 125. In some embodiments, the bump pad 140 is configured to receive a conductive element or the like. In some embodiments, the bump pad 140 is an under bump metallization (UBM) pad. In some embodiments, the bump pad 140 includes gold, silver, copper, nickel, tungsten, aluminum, palladium, titanium, tantalum, titanium/copper, and/or alloys thereof. In some embodiments, the bump pad 140 includes a titanium layer and a copper layer. In some embodiments, a width W9 of the bump pad 140 is substantially greater than the width W8 of the second capping layer 125.

In some embodiments, a conductive bump 150 is disposed over the second conductive member 120 and electrically connected to the second conductive member 120. In some embodiments, the conductive bump 150 is disposed over the bump pad 140. In some embodiments, the conductive bump 150 includes conductive material such as solder, copper, nickel, gold or the like. In some embodiments, the conductive bump 150 is a solder ball, a ball grid array (BGA) ball, a controlled collapse chip connection (C4) bump, a pillar or the like. In some embodiments, the conductive bump 150 is in a spherical, hemispherical or cylindrical shape.

In some embodiments, the conductive bump 150 is disposed over the first conductive member 110, and the bump pad 140 is disposed between the first conductive member 110 and the corresponding conductive bump 150. In some embodiments, the conductive bump 150 is disposed over the third conductive member 130, and the bump pad 140 is disposed between the third conductive member 130 and the corresponding conductive bump 150.

In some embodiments, the second conductive member 120 and the third conductive member 130 are same as or different from each other in various aspects such as size, dimension, shape, function, circuitry, etc. FIGS. 4 and 5 illustrate only the first conductive member 110, the second conductive member 120 and the third conductive member 130 for clarity and simplicity, but such example is intended to be illustrative only, and is not intended to be limiting to the embodiments. A person ordinarily skilled in the art would readily understand that any suitable number of conductive members may be utilized, and all such combinations are fully intended to be included within the scope of the embodiments. Additionally, while the second conductive member 120 and the third conductive member 130 are illustrated as having similar features, this is intended to be illustrative and is not intended to limit the embodiments, as the second conductive member 120 and the third conductive member 130 may have similar configurations or different configurations in order to meet the desired functional capabilities.

Figure 6:
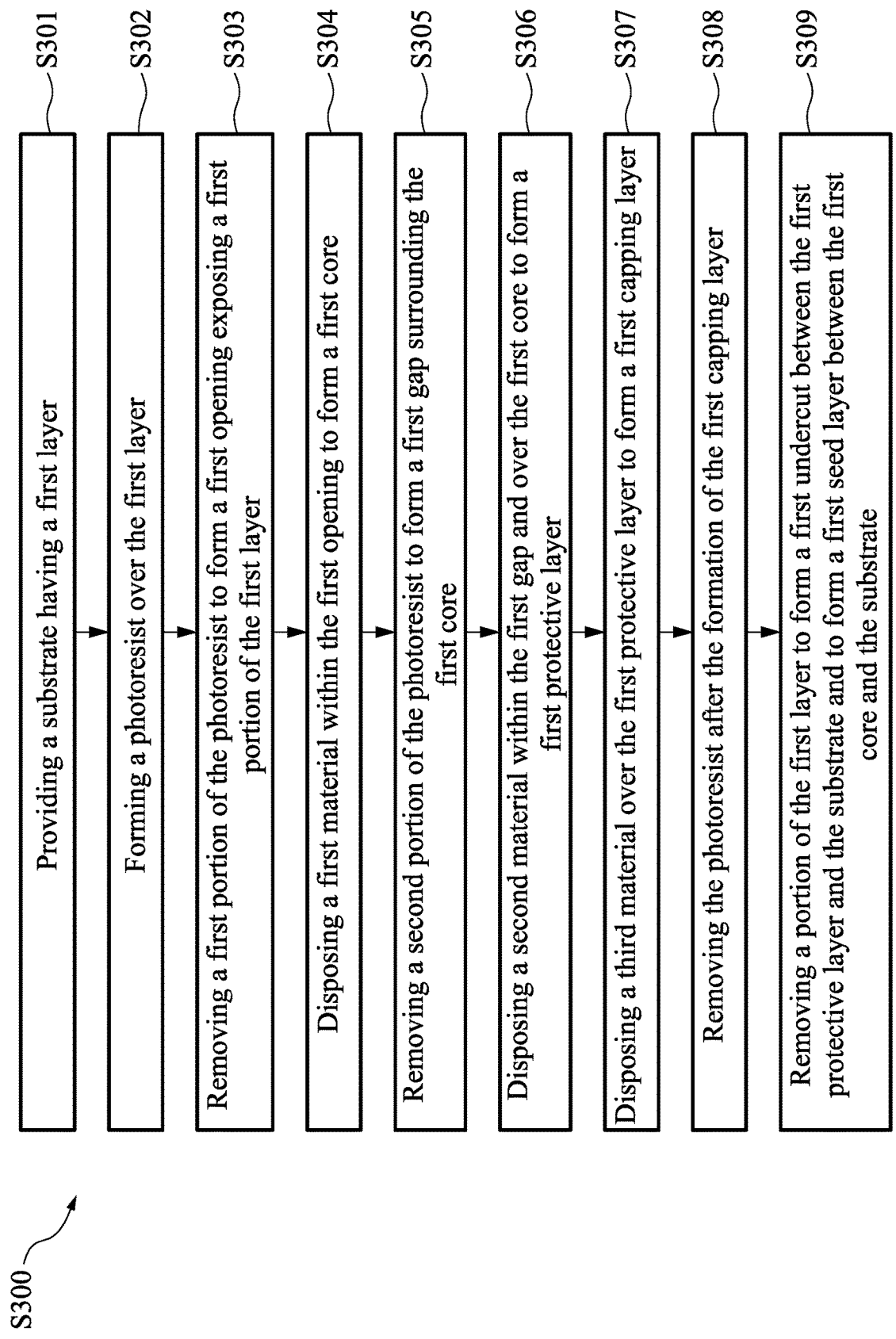
FIG. 6 is a flow diagram illustrating a method of manufacturing the third semiconductor structure in accordance with some embodiments of the present disclosure.

In the present application, a manufacturing method of the semiconductor structure having a protective layer on a sidewall of a conductive member is also provided. FIG. 6 is a flow diagram illustrating a method S300 of manufacturing the first semiconductor structure 100, the second semiconductor structure 100a or the third semiconductor structure 200 in accordance with some embodiments of the present disclosure, and FIGS. 7 to 21 are cross-sectional views and top views of intermediate stages in the formation of the first semiconductor structure 100, the second semiconductor structure 100a or the third semiconductor structure 200 in accordance with some embodiments of the present disclosure.

The stages shown in FIGS. 7 to 21 are also illustrated schematically in the flow diagram in FIG. 6. In the following discussion, the fabrication stages shown in FIGS. 7 to 21 are discussed in reference to the process steps shown in FIG. 6. The method S300 includes a number of operations and the description and illustration are not deemed as a limitation as the sequence of the operations.

The method S300 includes a number of steps (S301, S302, S303, S304, S305, S306, S307, S308 and S309). The method S300 includes providing a substrate having a first layer (S301); forming a photoresist over the first layer (S302); removing a first portion of the photoresist to form a first opening exposing a first portion of the first layer (S303); disposing a first material within the first opening to form a first core (S304); removing a second portion of the photoresist to form a first gap surrounding the first core (S305); disposing a second material within the first gap and over the first core to form a first protective layer (S306); disposing a third material over the first protective layer to form a first capping layer (S307); removing the photoresist after the formation of the first capping layer (S308); and removing a portion of the first layer to form a first undercut between the first protective layer and the substrate and to form a first seed layer between the first core and the substrate (S309).

Figure 7:
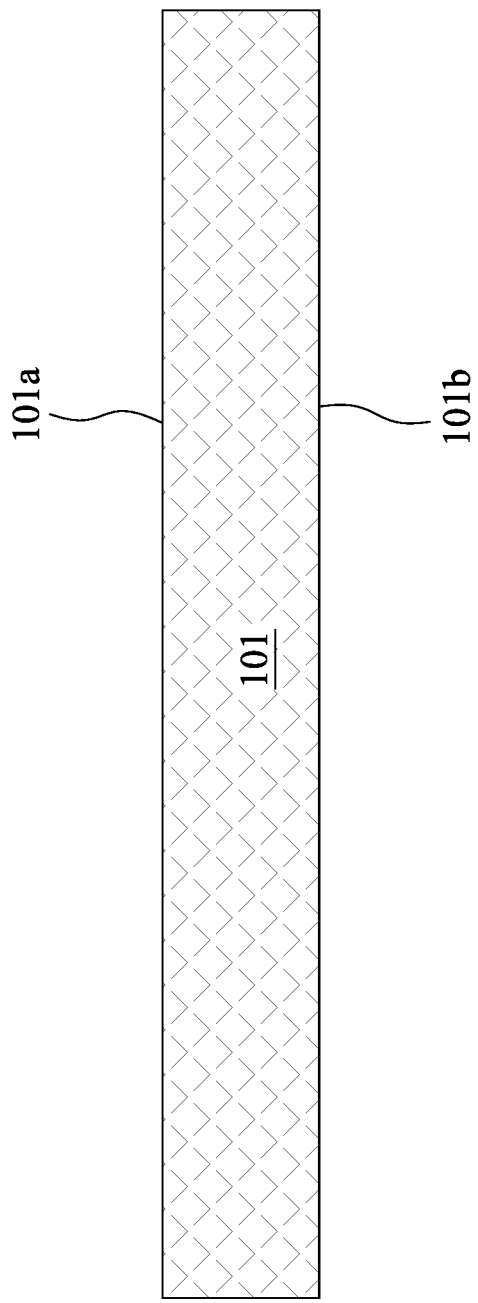
FIGS. 7 through 21 are cross-sectional views and top views of intermediate stages in formation of the third semiconductor structure in accordance with some embodiments of the present disclosure.
Figure 8:
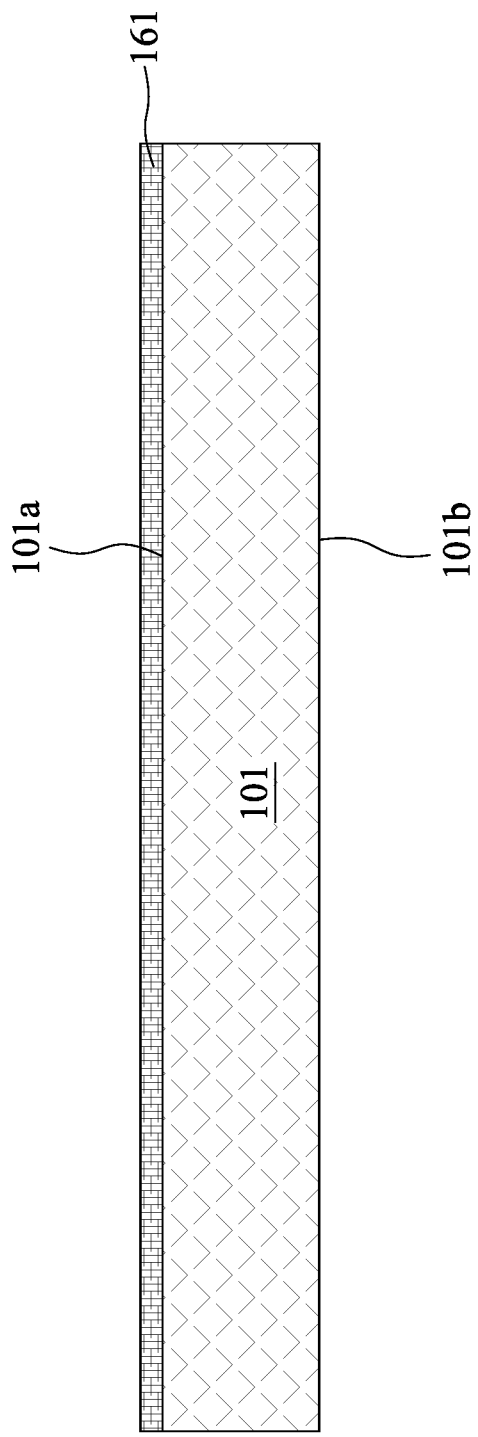

Referring to FIGS. 7 and 8, a substrate 101 having a first layer 161 disposed thereon is provided according to step S301 in FIG. 6. In some embodiments, the substrate 101 is provided as shown in FIG. 7. In some embodiments, the substrate 101 includes semiconductive material such as silicon, germanium, gallium, arsenic, or a combination thereof. In some embodiments, the substrate 101 is a silicon substrate. In some embodiments, the substrate 101 includes silicon dioxide or the like.

In some embodiments, the substrate 101 is defined with a first surface 101a and a second surface 101b opposite to the first surface 101a. In some embodiments, the first surface 101a is a front side of the substrate 101, and the second surface 101b is a back side of the substrate 101. In some embodiments, various features are formed in or over the first surface 101a of the substrate 101. In some embodiments, the substrate 101 has a configuration similar to that of the substrate 101 illustrated in FIGS. 1 to 3 and 5 and as discussed above.

In some embodiments, the first layer 161 is formed over the substrate 101 and covers the first surface 101a as shown in FIG. 8. In some embodiments, the formation of the first layer 161 includes disposing the first layer 161 over the substrate 101 as shown in FIG. 8.

In some embodiments, the first layer 161 is disposed by deposition, chemical vapor deposition (CVD) or any other suitable process. In some embodiments, the first layer 161 is a single layer or a composite stack and is formed with material such as copper, titanium, tungsten, tantalum, titanium/copper, or a combination thereof. In some embodiments, the first layer 161 includes a titanium layer and a copper layer.

Figure 9:
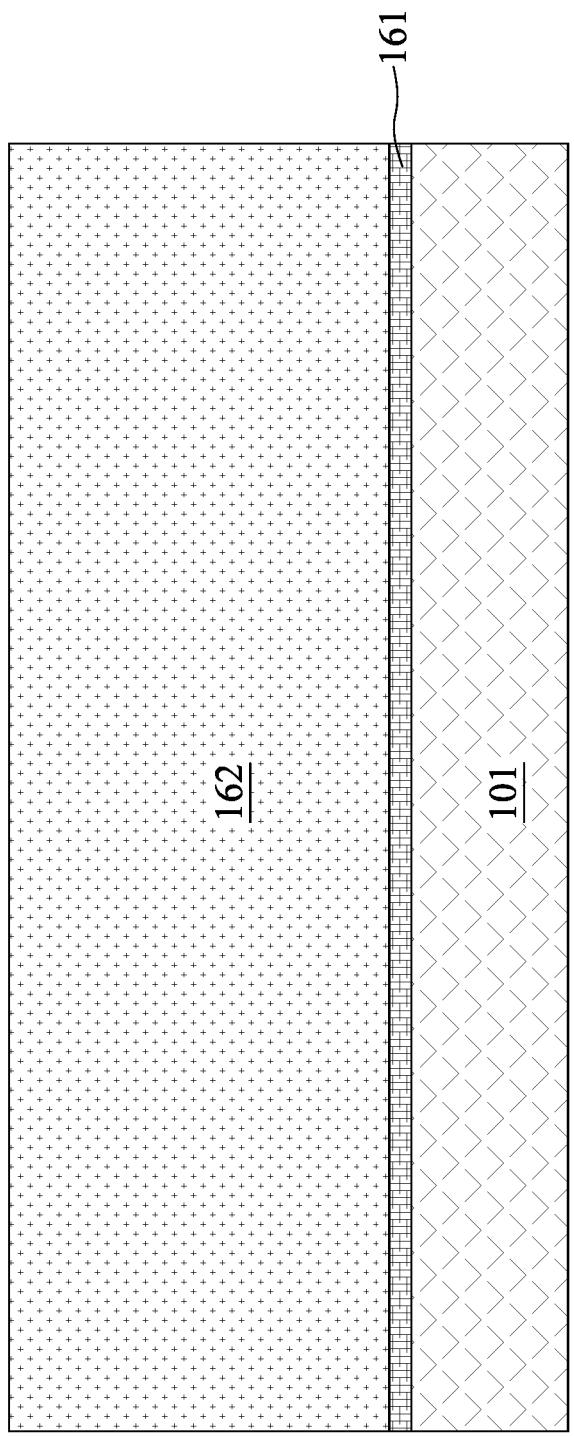

Referring to FIG. 9, a photoresist 162 is formed over the first layer 161 according to step S302 in FIG. 6. In some embodiments, the photoresist 162 covers the first layer 161.

Figure 10:
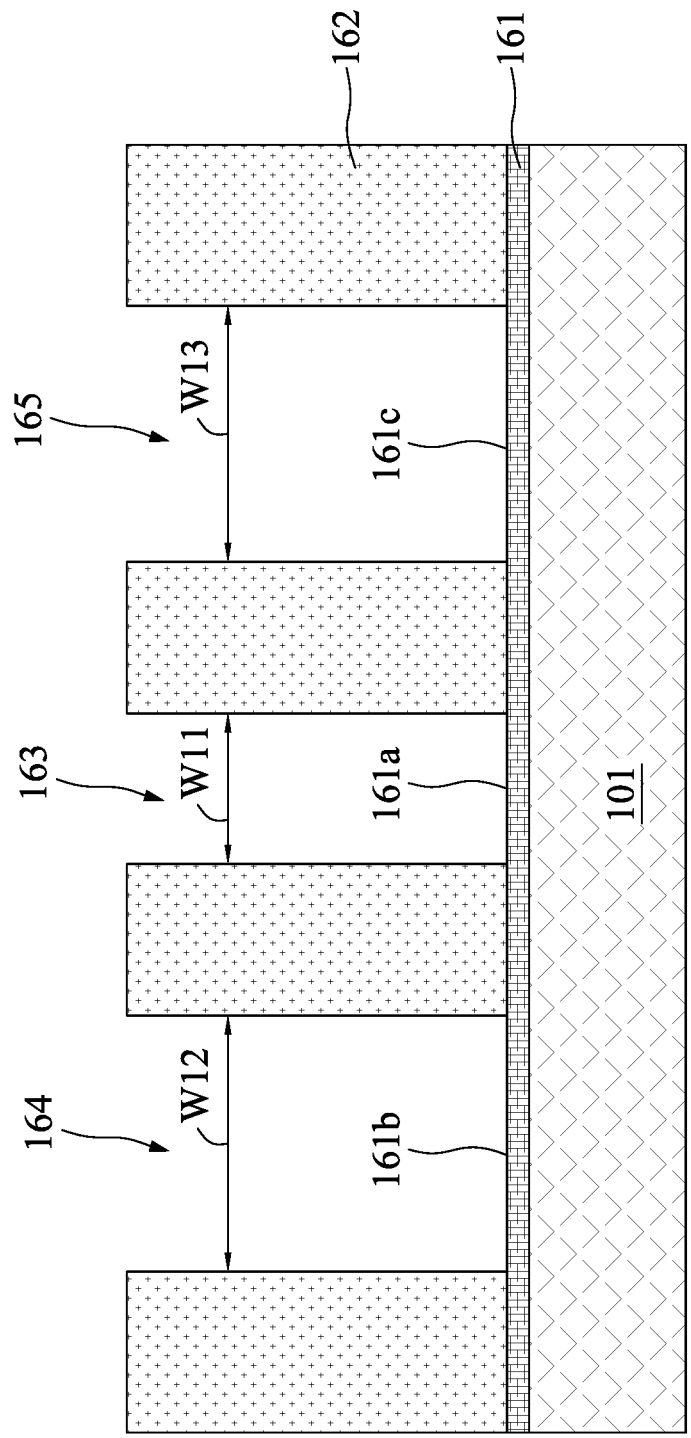
Figure 11:
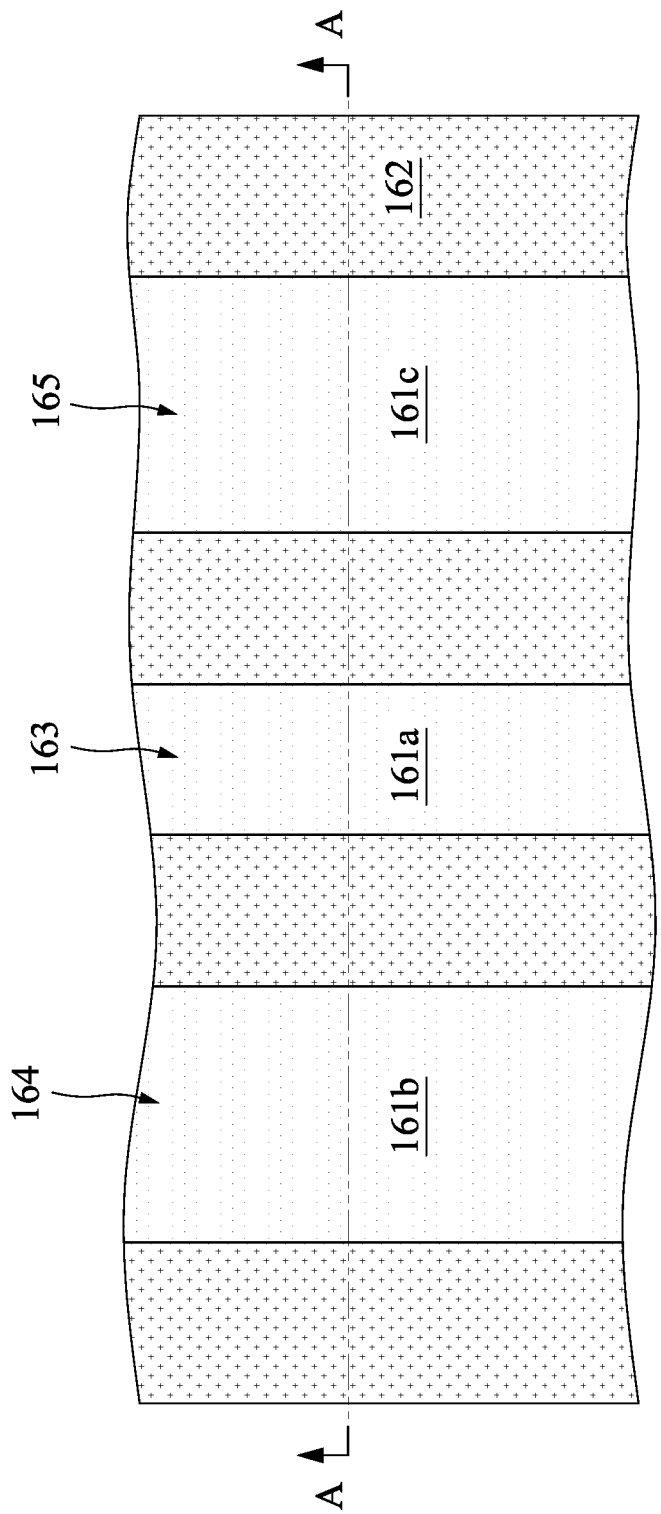

Referring to FIGS. 10 and 11, a first portion of the photoresist 162 is removed to form a first opening 163 exposing a first portion 161a of the first layer 161 according to step S303 in FIG. 6. In some embodiments, the first portion of the photoresist 162 is removed by etching or any other suitable process. In some embodiments, the first portion 161a of the first layer 161 has a strip configuration from a top view perspective.

In some embodiments, a third portion of the photoresist 162 is removed to form a second opening 164 exposing a third portion 161b of the first layer 161, wherein the third portion 161b of the first layer 161 is adjacent to the first portion 161a of the first layer 161. In some embodiments, at least a portion of the photoresist 162 is disposed between the first opening 163 and the second opening 164. In some embodiments, a width W12 of the second opening 164 is greater than a width W11 of the first opening 163. In some embodiments, the width W11 of the first opening 163 is less than 5 µm. In some embodiments, the width W12 of the second opening 164 is equal to the width W11 of the first opening 163. In some embodiments, the third portion 161b of the first layer 161 has a strip configuration from a top view perspective.

In some embodiments, a fifth portion of the photoresist 162 is removed to form a third opening 165 exposing a fifth portion 161c of the first layer 161, wherein the fifth portion 161c of the first layer 161 is adjacent to the first portion 161a of the first layer 161. In some embodiments, at least a portion of the photoresist 162 is disposed between the first opening 163 and the third opening 165. In some embodiments, a width W13 of the third opening 165 is greater than the width W11 of the first opening 163. In some embodiments, the width W13 of the third opening 165 is similar to the width W12 of the second opening 164. In some embodiments, the fifth portion 161c of the first layer 161 has a strip configuration from a top view perspective.

Figure 12:
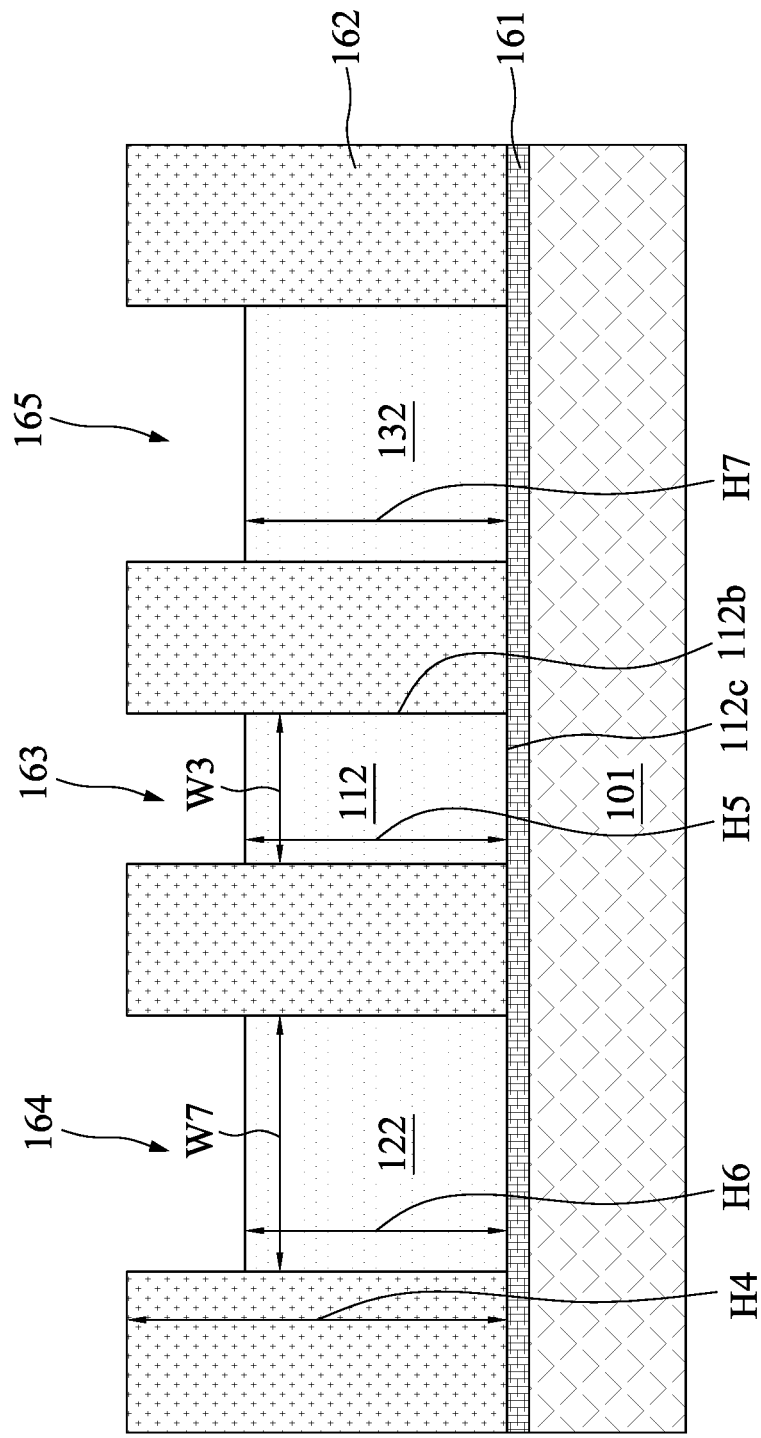

Referring to FIG. 12, a first material is disposed within the first opening 163 to form a first core 112 according to step S304 in FIG. 6. In some embodiments, the first material includes conductive material such as copper. The first material may be deposited by physical vapor deposition (PVD), CVD, atomic layer deposition (ALD), sputter deposition, or another technique for depositing the selected material.

In some embodiments, a sidewall 112b of the first core 112 is surrounded by the photoresist 162. In some embodiments, a bottom wall 112c of the first core 112 is in contact with the first layer 161. In some embodiments, a height H4 of the photoresist 162 is greater than a height H5 of the first core 112. In some embodiments, a width W3 of the first core 112 is equal to the width W11 of the first opening 163 as shown in FIG. 10.

In some embodiments, the first material is disposed within the second opening 164 to form a second core 122. The formation of the first core 112 and the formation of the second core 122 are performed separately or simultaneously. In some embodiments, a width W7 of the second core 122 is equal to the width W12 of the second opening 164 as shown in FIG. 10. In some embodiments, a height H6 of the second core 122 is equal to the height H5 of the first core 112.

In some embodiments, the first material is disposed within the third opening 165 to form a third core 132. The formation of the third core 132 and the formation of the second core 122 are performed separately or simultaneously. The formation of the third core 132 and the formation of the first core 112 are performed separately or simultaneously. In some embodiments, a height H7 of the third core 132 is equal to the height H5 of the first core 112. In some embodiments, a configuration of the third core 132 is similar to a configuration of the second core 122.

In some embodiments, the first core 112, the second core 122 and the third core 132 have configurations similar to those of the first core 112, the second core 122 and the third core 132 illustrated in FIGS. 1 to 3 and 5 and as discussed above.

Figure 13:
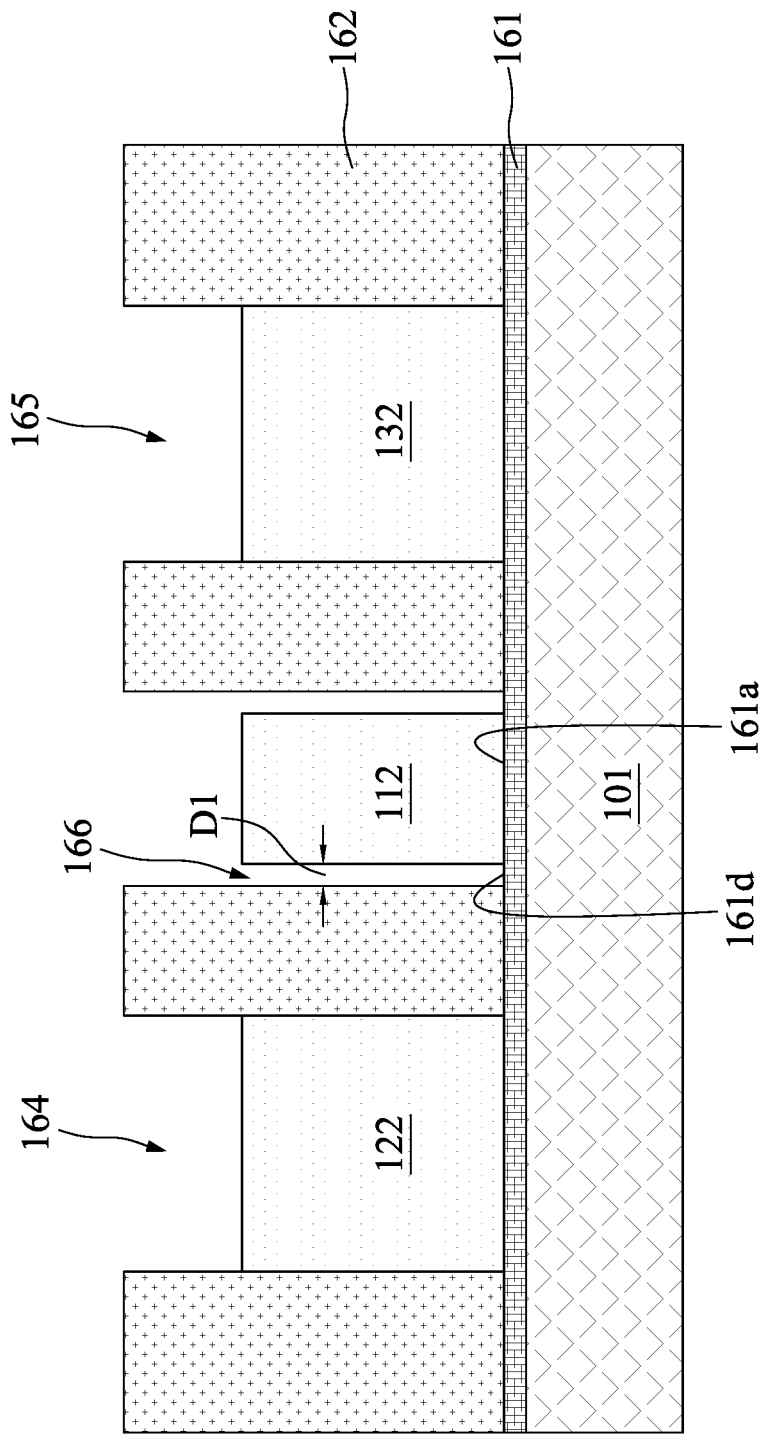

Referring to FIG. 13, a second portion of the photoresist 162 is removed to form a first gap 166 surrounding the first core 112 according to step S305 in FIG. 6. In some embodiments, the second portion of the photoresist 162 is trimmed to form the first gap 166. In some embodiments, a second portion 161d of the first layer 161 is exposed through the first gap 166 after the removal of the second portion of the photoresist 162. In some embodiments, the second portion 161d of the first layer 161 surrounds the first portion 161a of the first layer 161. In some embodiments, the second portion of the photoresist 162 is removed by etching or any other suitable process. In some embodiments, the second portion of the photoresist 162 is removed by plasma ashing. In some embodiments, the plasma is oxygen ($O_2$) plasma. In some embodiments, a distance D1 between the first core 112 and the photoresist 162 is between 0.2 µm and 1 µm after the first gap 166 is formed.

Figure 14:
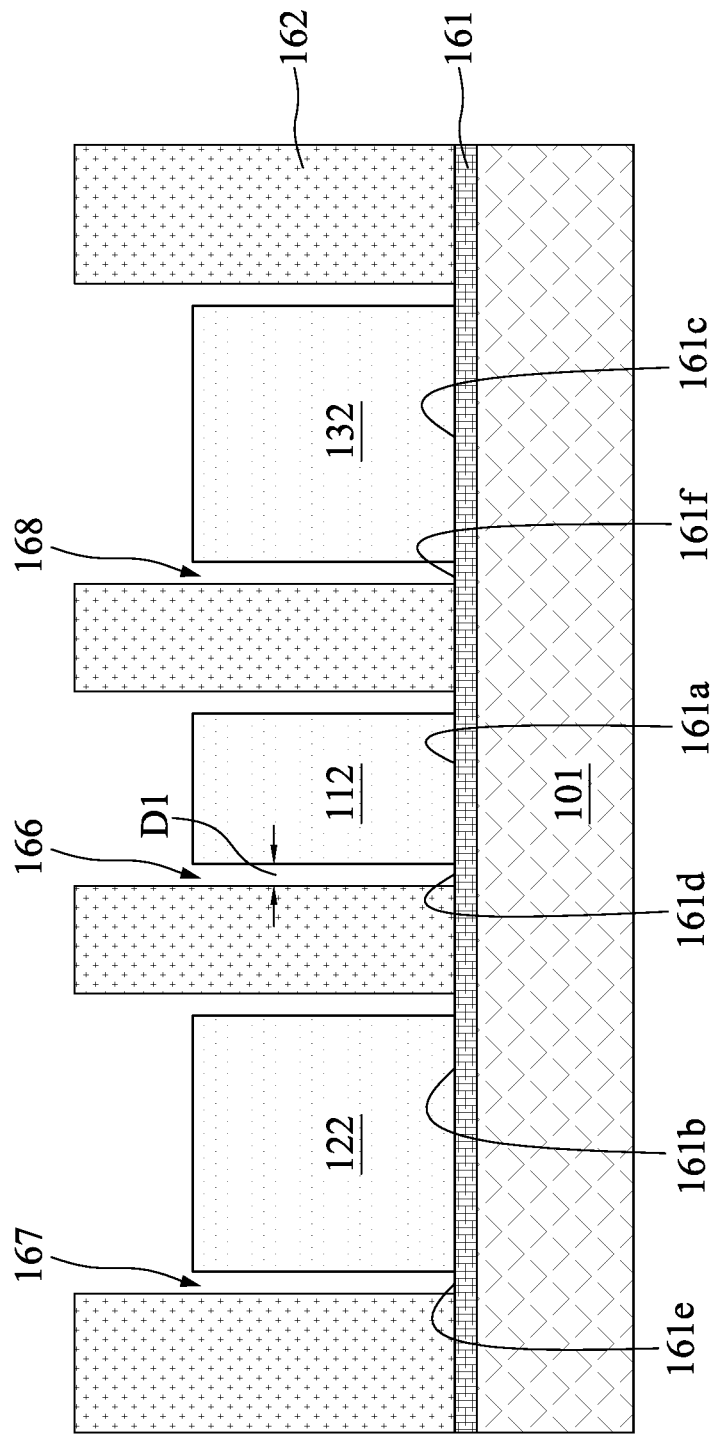
Figure 15:
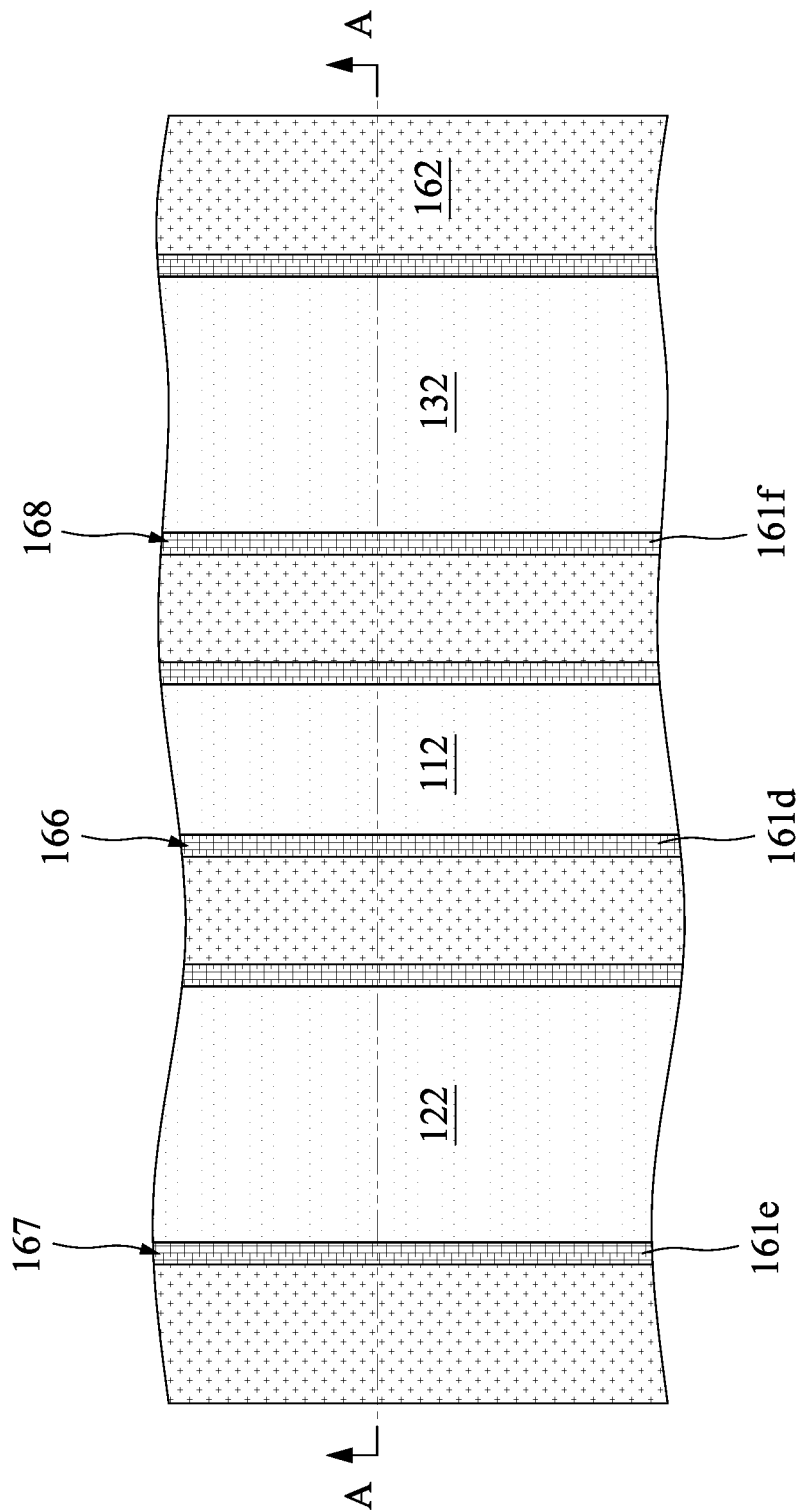

In some embodiments, referring to FIGS. 14 and 15, a fourth portion of the photoresist 162 is removed to form a second gap 167 surrounding the second core 122. In some embodiments, a fourth portion 161e of the first layer 161 is exposed through the second gap 167 after the removal of the fourth portion of the photoresist 162. In some embodiments, the fourth portion 161e of the first layer 161 surrounds the third portion 161b of the first layer 161. In some embodiments, the fourth portion of the photoresist 162 is removed by etching or any other suitable process. In some embodiments, the fourth portion of the photoresist 162 is removed by plasma ashing. In some embodiments, the plasma is $O_2$ plasma. In some embodiments, the formation of the first gap 166 and the formation of the second gap 167 are performed separately or simultaneously. In some embodiments, the formation of the first gap 166 is performed prior to the formation of the second gap 167.

In some embodiments, a sixth portion of the photoresist 162 is removed to form a third gap 168 surrounding the third core 132. In some embodiments, a sixth portion 161f of the first layer 161 is exposed through the third gap 168 after the removal of the sixth portion of the photoresist 162. In some embodiments, the sixth portion 161f of the first layer 161 surrounds the fifth portion 161c of the first layer 161. In some embodiments, the sixth portion of the photoresist 162 is removed by etching or any other suitable process. In some embodiments, the sixth portion of the photoresist 162 is removed by plasma ashing. In some embodiments, the formation of the third gap 168 and the formation of the first gap 166 are performed separately or simultaneously. In some embodiments, the formation of the third gap 168 and the formation of the second gap 167 are performed simultaneously.

Figure 16:
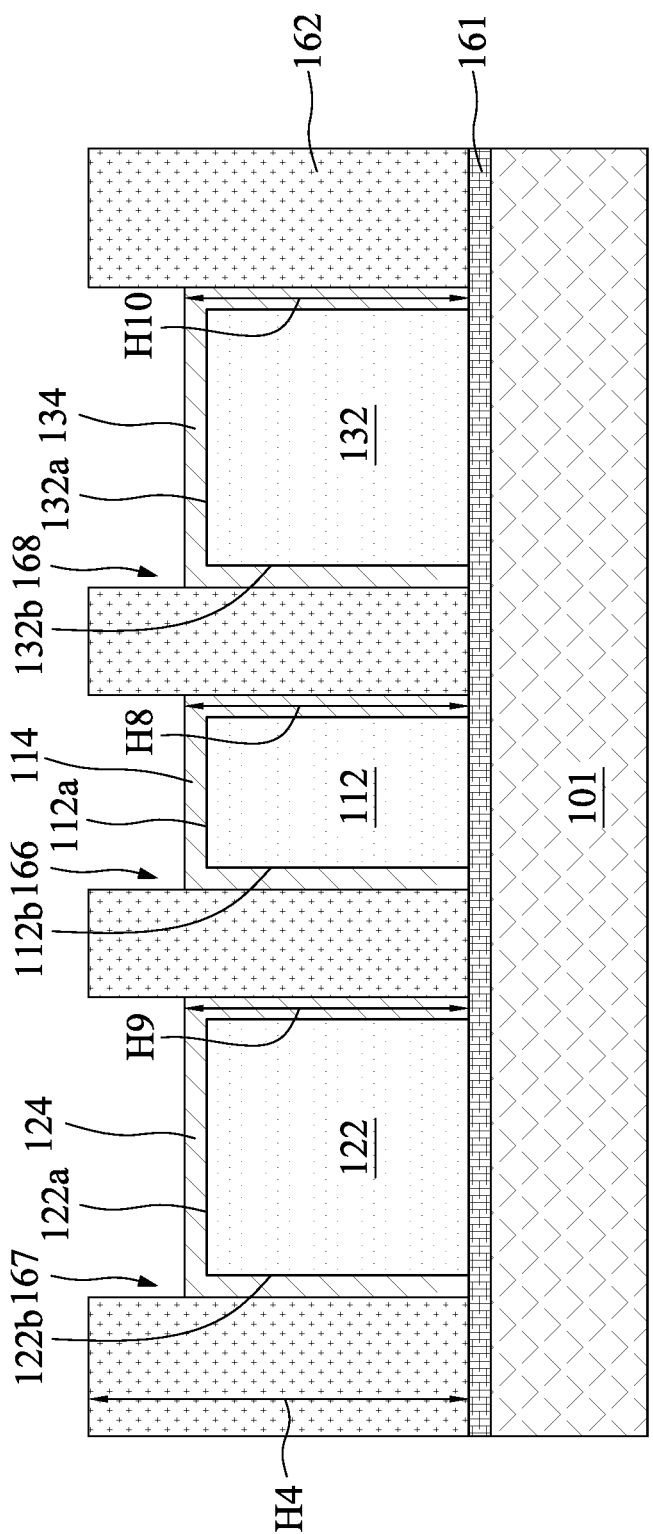

Referring to FIG. 16, a second material is disposed within the first gap 166 and over the first core 112 to form a first protective layer 114 according to step S306 in FIG. 6. In some embodiments, the second material fills the first gap 166 and is disposed over the first core 112 to form the first protective layer 114, and the thus-formed first protective layer 114 is disposed on a top surface 112a of the first core 112 and on the sidewall 112b of the first core 112. In some embodiments, the second material within the first gap 166 is in contact with the first layer 161. In some embodiments, a thickness T1 of the first protective layer 114 formed within the first gap 166 is between 0.2 µm and 1 µm.

In some embodiments, the second material is more cathodic than the first material. In some embodiments, an anodic index of the second material is greater than an anodic index of the first material. In some embodiments, the second material includes nickel. The second material may be deposited by PVD, CVD, ALD, sputter deposition, or another technique for depositing the selected material. In some embodiments, the second material is disposed by electroplating.

In some embodiments, the second material is disposed within the second gap 167 and over the second core 122 to form a second protective layer 124. In some embodiments, the second material fills the second gap 167 and is disposed over the second core 122 to form the second protective layer 124, and the thus-formed second protective layer 124 is disposed on a top surface 122a of the second core 122 and on a sidewall 122b of the second core 122. In some embodiments, the second material within the second gap 167 is in contact with the first layer 161. In some embodiments, the formation of the second protective layer 124 and the formation of the first protective layer 114 are performed separately or simultaneously. In some embodiments, the formation of the first protective layer 114 is performed prior to the formation of the second protective layer 124. In some embodiments, the formation of the second protective layer 124 and the formation of the first protective layer 114 are performed simultaneously.

In some embodiments, the second material is disposed within the third gap 168 and over the third core 132 to form a third protective layer 134. In some embodiments, the second material fills the third gap 168 and is disposed over the third core 132 to form the third protective layer 134, and the thus-formed third protective layer 134 is disposed on a top surface 132a of the third core 132 and on a sidewall 132b of the third core 132. In some embodiments, the second material within the third gap 168 is in contact with the first layer 161. In some embodiments, the formation of the third protective layer 134 and the formation of the first protective layer 114 are performed separately or simultaneously. In some embodiments, the formation of the third protective layer 134 and the formation of the second protective layer 124 are performed separately or simultaneously. In some embodiments, the formation of the first protective layer 114 is performed prior to the formation of the third protective layer 134. In some embodiments, the formation of the second protective layer 124 and the formation of the third protective layer 134 are performed simultaneously.

In some embodiments, the first protective layer 114, the second protective layer 124 and the third protective layer 134 have configurations similar to those of the first protective layer 114, the second protective layer 124 and the third protective layer 134 illustrated in FIGS. 1 to 3 and 5 and as discussed above.

Figure 17:
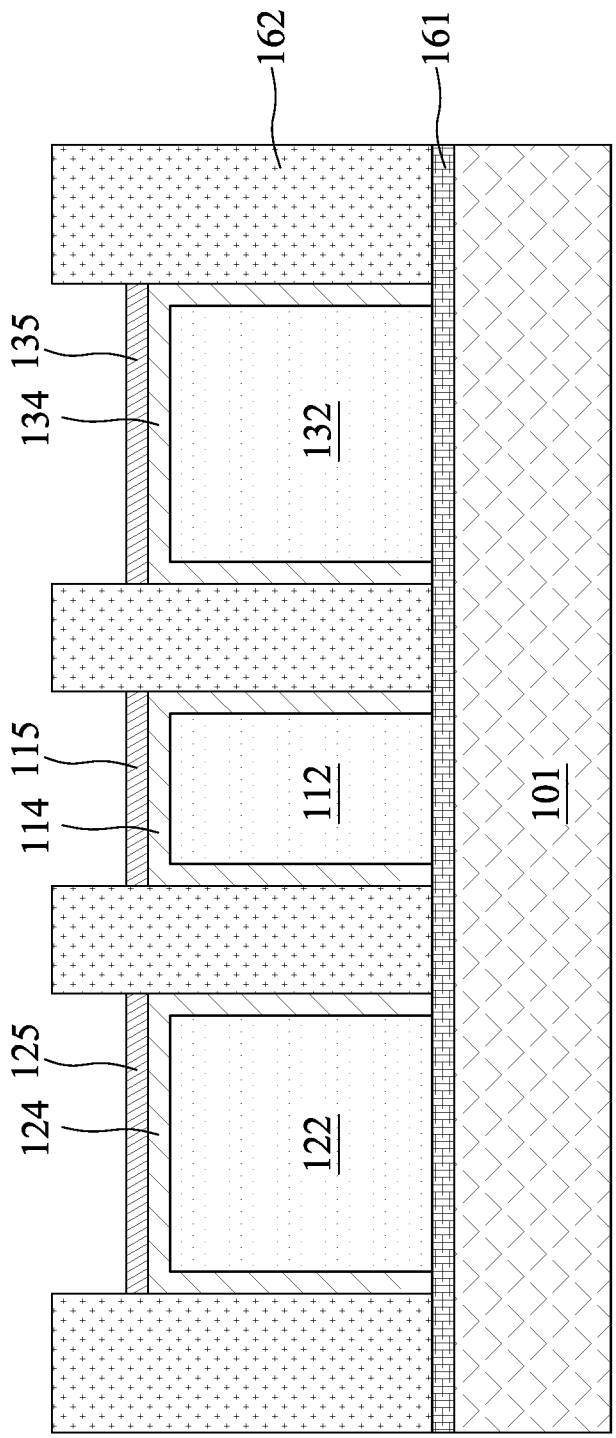

Referring to FIG. 17, a third material is disposed over the first protective layer 114 to form a first capping layer 115 according to step S307 in FIG. 6. In some embodiments, the first capping layer 115 covers the first protective layer 114. In some embodiments, the third material includes gold.

In some embodiments, the third material is disposed over the second protective layer 124 to form a second capping layer 125. In some embodiments, the second capping layer 125 covers the second protective layer 124. In some embodiments, the formation of the second capping layer 125 and the formation of the first capping layer 115 are performed separately or simultaneously. In some embodiments, the formation of the first capping layer 115 is performed prior to the formation of the second capping layer 125. In some embodiments, the formation of the second capping layer 125 and the formation of the first capping layer 115 are performed simultaneously.

In some embodiments, the third material is disposed over the third protective layer 134 to form a third capping layer 135. In some embodiments, the third capping layer 135 covers the third protective layer 134. In some embodiments, the formation of the third capping layer 135 and the formation of the first capping layer 115 are performed separately or simultaneously. In some embodiments, the formation of the third capping layer 135 and the formation of the second capping layer 125 are performed separately or simultaneously. In some embodiments, the formation of the first capping layer 115 is performed prior to the formation of the third capping layer 135. In some embodiments, the formation of the second capping layer 125 and the formation of the third capping layer 135 are performed simultaneously.

In some embodiments, the first capping layer 115, the second capping layer 125 and the third capping layer 135 have configurations similar to those of the first capping layer 115, the second capping layer 125 and the third capping layer 135 illustrated in FIGS. 1 to 3 and 5 and as discussed above.

Figure 18:
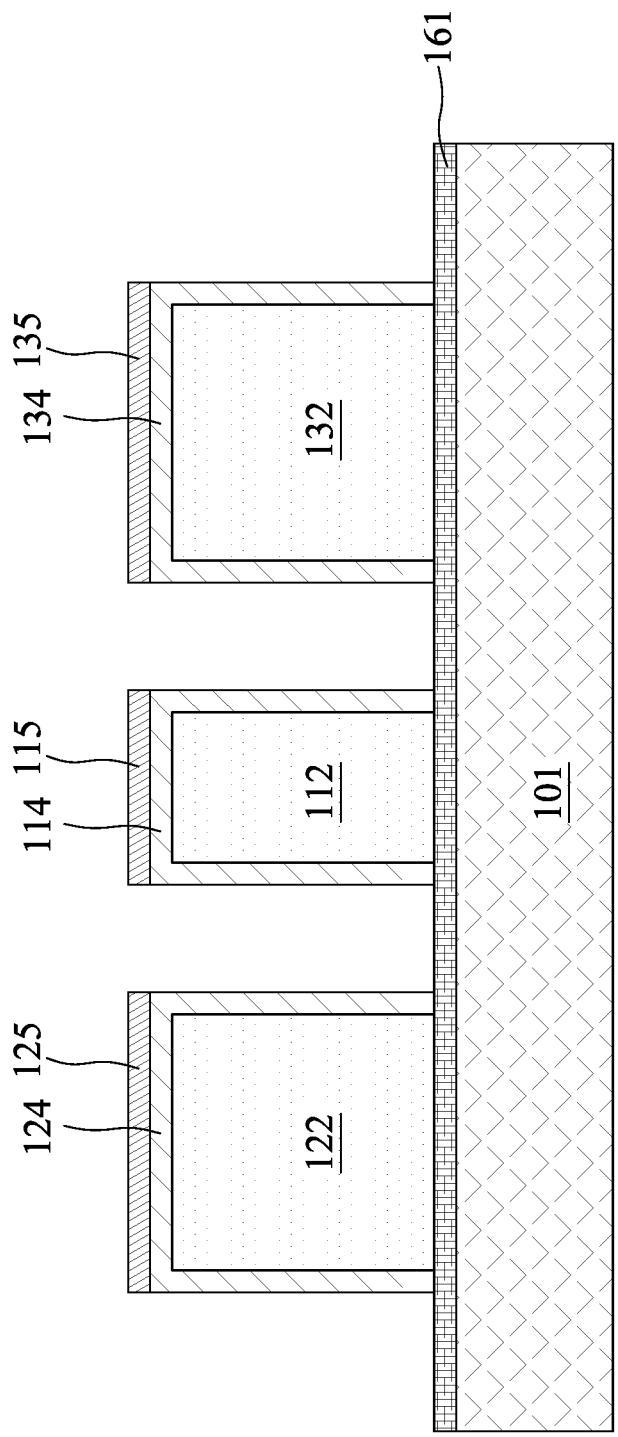

Referring to FIG. 18, the photoresist 162 is removed after the formation of the first capping layer 115 according to step S308 in FIG. 6. In some embodiments, the remaining photoresist 162 disposed over the first layer 161 is removed by etching or any other suitable operation. In some embodiments, the photoresist 162 is removed by wet etching or any other suitable process. In some embodiments, the first layer 161 is exposed after the photoresist 162 is removed.

Figure 19:
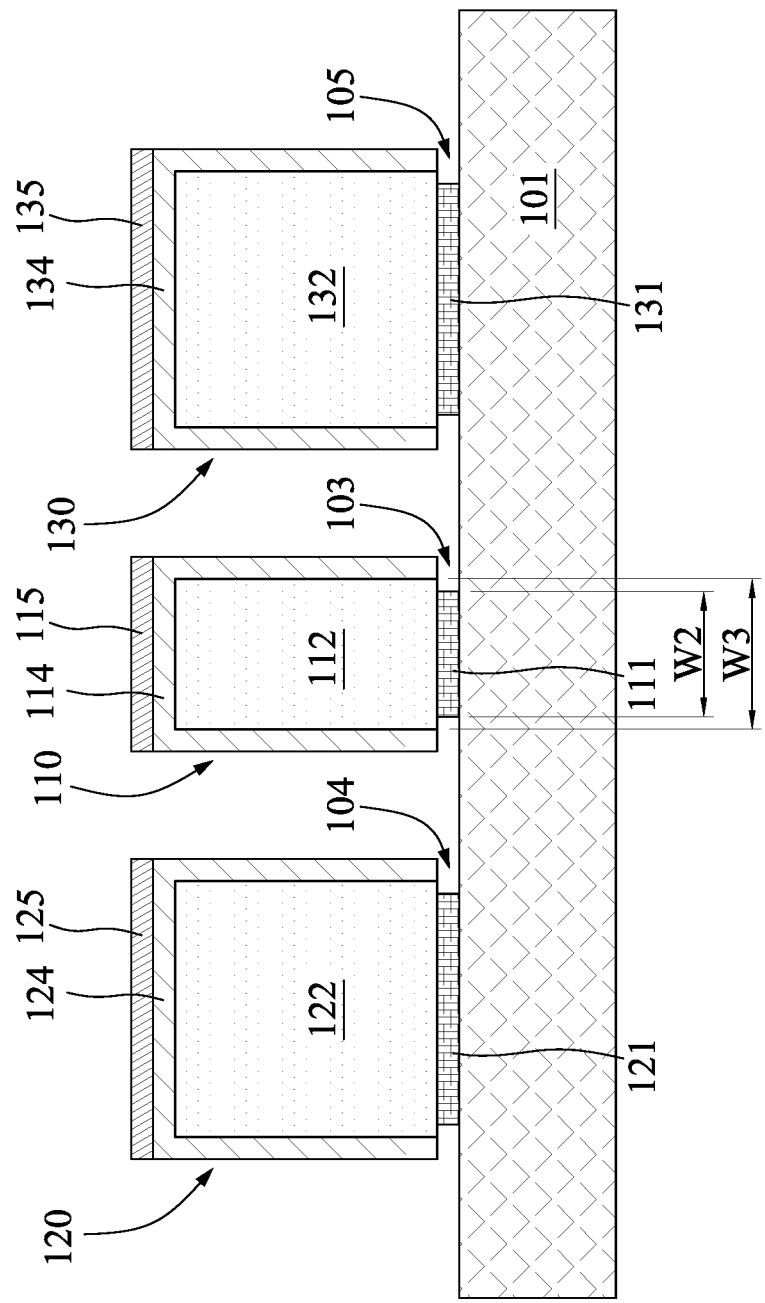

Referring to FIG. 19, a portion of the first layer 161 is removed to form a first undercut 103 between the first protective layer 114 and the substrate 101 and to form a first seed layer 111 between the first core 112 and the substrate 101 according to step S309 in FIG. 6. In some embodiments, the first seed layer 111, the first core 112, the first protective layer 114 and the first capping layer 115 form a first conductive member 110.

In some embodiments, the exposed portion of the first layer 161 is removed by etching or any other suitable operation, and the first undercut 103 is formed between the first protective layer 114 and the substrate 101. In some embodiments, the first undercut 103 is formed between a portion of the first core 112 and the substrate 101. In some embodiments, the first core 112 is disposed over the first seed layer 111 after the portion of the first layer 161 is removed, and the first undercut 103 is formed under the first core 112. The first core 112 is not damaged during the formation of the first seed layer 111, and the thus-formed first conductive member 110 can be stably placed on the substrate 101.

In some embodiments, a width W2 of the first seed layer 111 is equal to a width W3 of the first core 112. In some embodiments, the width W2 of the first seed layer 111 is less than the width W3 of the first core 112.

In some embodiments, a portion of the first layer 161 is removed to form a second undercut 104 between the second protective layer 124 and the substrate 101 and to form a second seed layer 121 between the second core 122 and the substrate 101. In some embodiments, the second seed layer 121, the second core 122, the second protective layer 124 and the second capping layer 125 form a second conductive member 120.

In some embodiments, the first undercut 103 and the second undercut 104 are formed separately or simultaneously. In some embodiments, the formation of the first conductive member 110 and the formation of the second conductive member 120 are performed separately or simultaneously. In some embodiments, the formation of the first conductive member 110 is performed prior to the formation of the second conductive member 120. In some embodiments, the formation of the first conductive member 110 and the formation of the second conductive member 120 are performed simultaneously.

In some embodiments, a portion of the first layer 161 is removed to form a third undercut 105 between the third protective layer 134 and the substrate 101 and to form a third seed layer 131 between the third core 132 and the substrate 101. In some embodiments, the third seed layer 131, the third core 132, the third protective layer 134 and the third capping layer 135 form a third conductive member 130.

In some embodiments, the first undercut 103 and the third undercut 105 are formed separately or simultaneously. In some embodiments, the formation of the first conductive member 110 and the formation of the third conductive member 130 are performed separately or simultaneously. In some embodiments, the formation of the first conductive member 110 is performed prior to the formation of the third conductive member 130. In some embodiments, the formation of the first conductive member 110 and the formation of the third conductive member 130 are performed simultaneously. In some embodiments, the formation of the second conductive member 120 and the formation of the third conductive member 130 are performed simultaneously. In some embodiments, the second conductive member 120 has a configuration similar to that of the third conductive member 130 illustrated in FIGS. 1 to 3 and 5 and discussed above.

Figure 20:
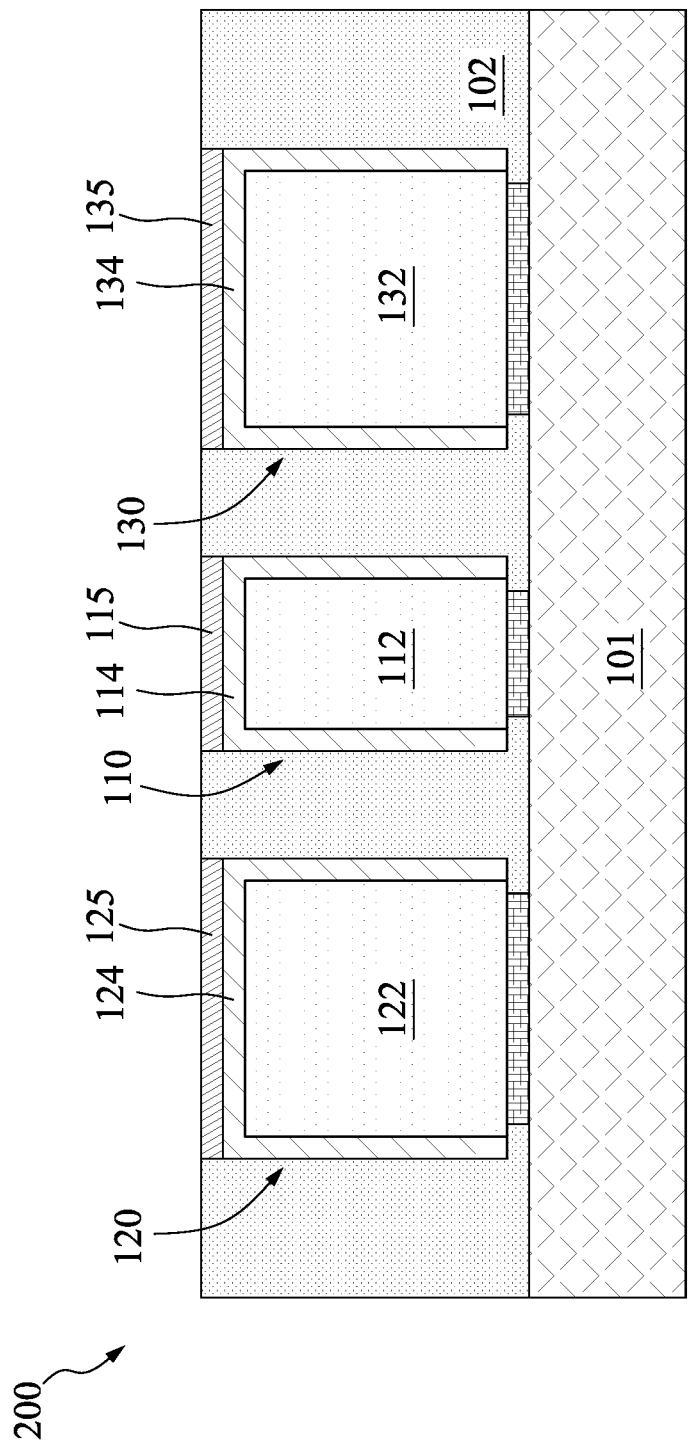

In some embodiments, referring to FIG. 20, a dielectric layer 102 is formed over the substrate 101 to surround the first conductive member 110. In some embodiments, the dielectric layer 102 is disposed within the first undercut 103. In some embodiments, the dielectric layer 102 is disposed between the first protective layer 114 and the substrate 101. In some embodiments, the first conductive member 110 is exposed through the dielectric layer 102. In some embodiments, the first capping layer 115 is exposed through the dielectric layer 102.

In some embodiments, the dielectric layer 102 surrounds the first conductive member 110, the second conductive member 120 and the third conductive member 130. In some embodiments, the dielectric layer 102 is disposed within the second undercut 104. In some embodiments, the dielectric layer 102 is disposed between the second protective layer 124 and the substrate 101. In some embodiments, the second conductive member 120 is exposed through the dielectric layer 102. In some embodiments, the second capping layer 125 is exposed through the dielectric layer 102.

In some embodiments, the dielectric layer 102 is disposed within the third undercut 105. In some embodiments, the dielectric layer 102 is disposed between the third protective layer 134 and the substrate 101. In some embodiments, the third conductive member 130 is exposed through the dielectric layer 102. In some embodiments, the third capping layer 135 is exposed through the dielectric layer 102.

Figure 21:
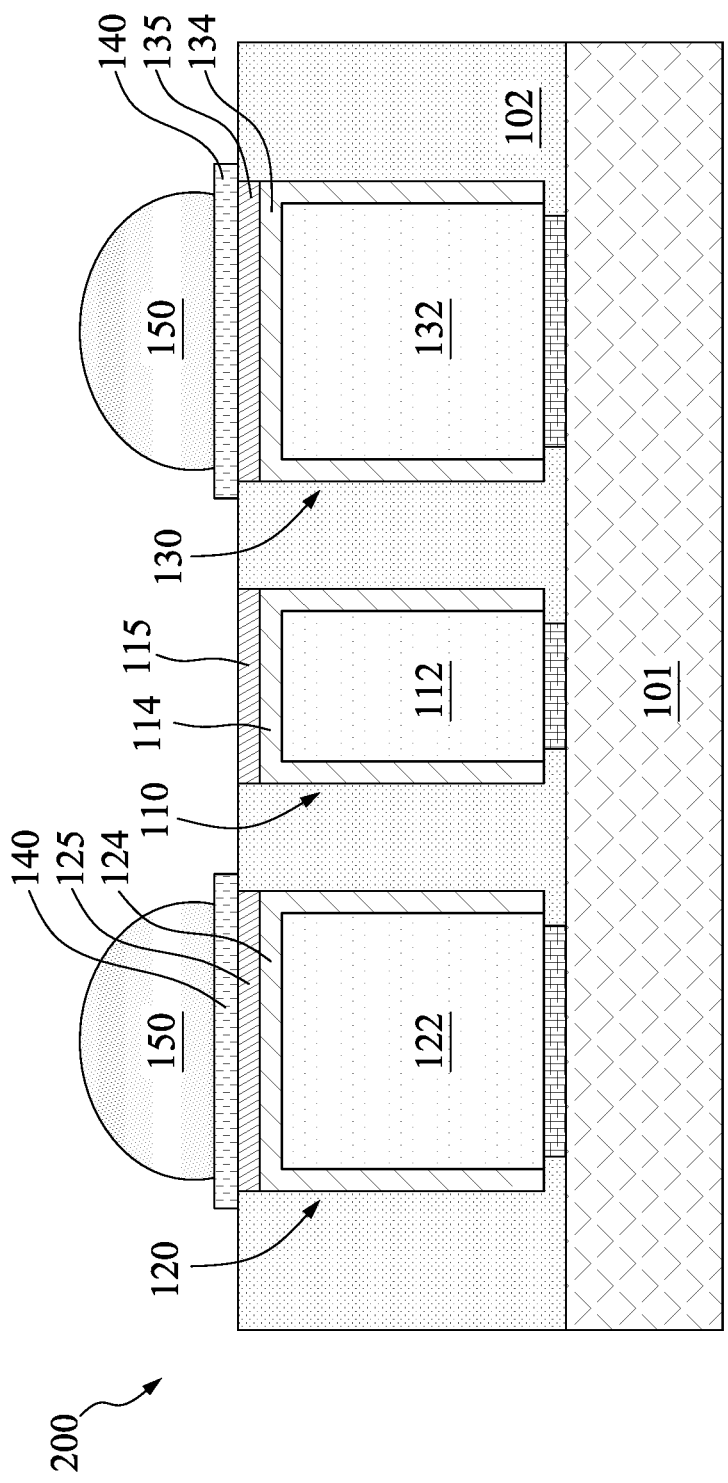

In some embodiments, referring to FIG. 21, the method S300 further includes disposing a bump pad 140 over the second conductive member 120. In some embodiments, the bump pad 140 is disposed over the dielectric layer 102 and covers the second conductive member 120. In some embodiments, the bump pad 140 is a UBM pad. In some embodiments, each of the second conductive member 120 and the third conductive member 130 has a bump pad 140 disposed thereon.

In some embodiments, the method S300 further includes disposing a conductive bump 150 over the bump pad 140. In some embodiments, a plurality of the conductive bumps 150 are disposed over the bump pads 140, wherein one of the conductive bumps 150 is disposed over each of the bump pads 140. In some embodiments, the conductive bump 150 is in contact with the corresponding bump pad 140. In some embodiments, the formation of the conductive bump 150 includes disposing a soldering material on the bump pad 140. In some embodiments, the soldering material is disposed by plating or any other suitable process. In some embodiments, the conductive bump 150 includes low-temperature reflowable material.

In conclusion, because a conductive member includes a protective layer disposed on a top surface of a core and surrounding a sidewall of the core, the protective layer mitigates galvanic corrosion during etching process, thereby reducing or eliminating loss of the core due to the galvanic corrosion. As such, the conductive member with the protective layer may have a relativity narrow width and still maintain strength and reliability. Further, an undercut surrounding a seed layer under the core may be reduced, and collapse or fracture of the conductive member can be prevented. A reliability of a semiconductor structure having such conductive member is thereby increased or improved.

One aspect of the present disclosure provides a semiconductor structure. The semiconductor structure includes a substrate and a conductive member disposed over the substrate. The conductive member includes a seed layer disposed over the substrate, a core disposed over the seed layer, and a protective layer disposed on a top surface of the core and surrounding a sidewall of the core.

Another aspect of the present disclosure provides a semiconductor structure. The semiconductor structure includes a substrate and a first conductive member disposed over the substrate. The first conductive member includes a first seed layer disposed over the substrate, a first core disposed over the seed layer, a first protective layer disposed on a top surface of the first core and on a sidewall of the first core, and a first capping layer disposed over the first protective layer.

Another aspect of the present disclosure provides a method of manufacturing a semiconductor structure. The method includes steps of providing a substrate having a first layer; forming a photoresist over the first layer; removing a first portion of the photoresist to form a first opening exposing a first portion of the first layer; disposing a first material within the first opening to form a first core; and removing a second portion of the photoresist to form a first gap surrounding the first core. The method further includes steps of disposing a second material within the first gap and over the first core to form a first protective layer; disposing a third material over the first protective layer to form a first capping layer; removing the photoresist after the formation of the first capping layer; and removing a portion of the first layer to form a first undercut between the first protective layer and the substrate and to form a first seed layer between the first core and the substrate.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
a substrate; and
a conductive member disposed over the substrate,
wherein the conductive member includes a seed layer disposed over the substrate, a core disposed over the seed layer, and a protective layer disposed on a top surface of the core and surrounding a sidewall of the core;
wherein the protective layer has a first portion disposed over the core and a second portion surrounding the core;
wherein a thickness of the first portion of the protective layer is equal to a thickness of the second portion of the protective layer;
wherein a width of the core is greater than a width of the seed layer, such that the seed layer is contactless with the protective layer.

2. The semiconductor structure of claim 1, wherein a width of the conductive member is greater than a width of the seed layer, and a thickness of the protective layer is 4% to 10% of the width of the conductive member.

3. The semiconductor structure of claim 1, wherein the core includes copper, and the protective layer includes nickel.

4. The semiconductor structure of claim 1, wherein the seed layer includes titanium and copper.

5. The semiconductor structure of claim 1, further comprising a capping layer disposed over the protective layer and the core; wherein the capping layer includes gold.

6. The semiconductor structure of claim 5, wherein the first portion of the protective layer is disposed between the capping layer and the core, and the second portion of the protective layer is disposed under the capping layer, wherein a width of the capping layer is equal to a width of the first portion of the protective layer and is equal to a width of the second portion of the protective layer.

7. The semiconductor structure of claim 1, wherein an undercut is formed between the protective layer and the substrate, wherein a depth of the undercut is equal to a thickness of the seed layer.

8. The semiconductor structure of claim 1, wherein the conductive member is a redistribution layer (RDL) line.

9. The semiconductor structure of claim 5, wherein a width of the capping layer is substantially greater than a width of the seed layer.

10. The semiconductor structure of claim 1, further comprising:
a dielectric layer over the substrate and surrounding the conductive member, wherein a sidewall and a bottom wall of the second portion of the protective layer are in contact with the dielectric layer.

11. A semiconductor structure, comprising:
a substrate; and
a first conductive member disposed over the substrate,
wherein the first conductive member includes a first seed layer disposed over and in contact with the substrate, a first core disposed over the seed layer, a first protective layer disposed on a top surface of the first core and on a sidewall of the first core, and a first capping layer disposed over the first protective layer;
wherein the first protective layer has a first portion disposed over the first core and a second portion surrounding the first core;
wherein the second portion of the first protective layer is disposed below the first protective layer
wherein a thickness of the first portion of the first protective layer is equal to a thickness of the second portion of the first protective layer.

12. The semiconductor structure of claim 11, further comprising:
a second conductive member disposed over the substrate and adjacent to the first conductive member,
wherein the second conductive member includes a second seed layer disposed over the substrate, a second core disposed over the second seed layer, a second protective layer disposed on a top surface of the second core and on a sidewall of the second core, and a second capping layer disposed over the second protective layer,
wherein a width of the second capping layer is substantially greater than a width of the second seed layer;
wherein a height of the first conductive member is equal to a height of the second conductive member.

13. The semiconductor structure of claim 12, wherein a width of the first conductive member is greater than or less than a width of the second conductive member; wherein the first protective layer and the second protective layer include a same material.

14. The semiconductor structure of claim 12, further comprising:
a dielectric layer over the substrate and surrounding the first conductive member and the second conductive member;
wherein the dielectric layer is at least partially in contact with a bottom wall of the first core;
wherein a sidewall and a bottom wall of the second portion of the first protective layer are in contact with the dielectric layer.

* * * * *